(12) United States Patent
Bang et al.

(10) Patent No.: US 12,507,542 B2
(45) Date of Patent: Dec. 23, 2025

(54) DISPLAY DEVICE INCLUDING SUB CONSTANT VOLTAGE CONNECTION LINE AND SUB DATA CONNECTION LINE

(71) Applicant: Samsung Display Co., LTD., Yongin-si (KR)

(72) Inventors: Ki Ho Bang, Hwaseong-si (KR); Seung Hwan Cho, Yongin-si (KR); Won Suk Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 630 days.

(21) Appl. No.: 17/748,191

(22) Filed: May 19, 2022

(65) Prior Publication Data

US 2023/0056517 A1    Feb. 23, 2023

(30) Foreign Application Priority Data

Aug. 18, 2021   (KR) .................. 10-2021-0108643

(51) Int. Cl.
*H10K 59/131*    (2023.01)
(52) U.S. Cl.
CPC ................ *H10K 59/131* (2023.02)
(58) Field of Classification Search
CPC .. H10K 59/124; H10K 59/131; H10K 59/121; H10K 59/60
USPC ........................................... 257/40
See application file for complete search history.

(56) References Cited

U.S. PATENT DOCUMENTS

| 10,852,607 | B2 | 12/2020 | Yeh et al. | |
|---|---|---|---|---|
| 11,538,888 | B2 | 12/2022 | Jeon et al. | |
| 11,625,069 | B2 | 4/2023 | Bang et al. | |
| 11,940,845 | B2 | 3/2024 | Bang et al. | |
| 12,216,503 | B2 | 2/2025 | Bang et al. | |
| 2011/0249315 | A1* | 10/2011 | Tao ....................... | G02B 26/001 156/247 |
| 2012/0248478 | A1* | 10/2012 | Lee ....................... | G02B 26/001 257/E33.072 |
| 2012/0249558 | A1* | 10/2012 | Lee ....................... | B81B 7/0006 359/290 |

(Continued)

FOREIGN PATENT DOCUMENTS

| KR | 1020170117291 | 10/2017 |
|---|---|---|
| KR | 1020200021029 | 2/2020 |

(Continued)

*Primary Examiner* — Jami Valentine Miller
(74) *Attorney, Agent, or Firm* — CANTOR COLBURN LLP

(57) ABSTRACT

A display device includes a substrate in which an active area and a non-active area surrounded by the active area are defined, where an optical hole is defined in the non-active area through the substrate; first and second sub constant voltage lines extended from the non-active area in opposite directions; a sub constant voltage connection line connecting the first and second sub constant voltage lines in the non-active area; first and second sub data lines extended from the non-active area in the opposite directions; and a sub data connection line connecting the first and second sub data lines in the non-active area. The sub data connection line is disposed in three or more different conductive layers, and the sub constant voltage connection line is disposed in a different conductive layer from the sub data connection line and insulated from the sub data connection line.

15 Claims, 21 Drawing Sheets

(56) References Cited

U.S. PATENT DOCUMENTS

| | | | | |
|---|---|---|---|---|
| 2018/0088386 A1* | 3/2018 | Enami | ............... | G09G 3/3648 |
| 2020/0152842 A1* | 5/2020 | Park | ............... | H10H 29/10 |
| 2022/0050984 A1* | 2/2022 | Park | ............... | G06V 40/1318 |

FOREIGN PATENT DOCUMENTS

| | | |
|---|---|---|
| KR | 1020210008201 A | 1/2021 |
| KR | 1020210034747 A | 3/2021 |
| KR | 1020210127270 | 10/2021 |

\* cited by examiner

120: 121, 123
130: 131
140: 141, 143, 145
150: 151
170: 171

DISPLAY DEVICE INCLUDING SUB CONSTANT VOLTAGE CONNECTION LINE AND SUB DATA CONNECTION LINE

This application claims priority to Korean Patent Application No. 10-2021-0108643, filed on Aug. 18, 2021, and all the benefits accruing therefrom under 35 U.S.C. 119, the content of which in its entirety is herein incorporated by reference.

BACKGROUND

1. Field

The disclosure relates to a display device.

2. Description of the Related Art

With the advancement of the information technology, the demand for a display device for displaying an image has increased in various fields. As the display device, various types of display device such as a liquid crystal display ("LCD") device and an organic light-emitting display ("OLED") device have been used. Among various types of display device, the organic light-emitting display device displays an image by using an organic light-emitting element that generates light by recombination of electrons and holes.

The display device typically includes a display area for displaying an image and a non-display area disposed in the vicinity of the display area. In the display device, lines for applying a signal to the display area are disposed in the non-display area.

BRIEF SUMMARY

Recently, a display device having a thin bezel has been desired. If a size of the non-display area is too reduced for a thin bezel, a path through which fan-out lines may pass may be insufficient. Therefore, some lines may be extended toward the display area after being fanned out from a pad portion. Particularly, a second power voltage line may be provided to include a mesh shape in the display area.

Embodiments of the disclosure are to provide a display device in which interference between a connection line between data lines and a connection line between constant voltage lines is minimized in the vicinity of an optical hole.

An embodiment of a display device according to the invention includes a substrate in which an active area and a non-active area are defined, where the non-active area includes a first non-active area positioned at an edge of the active area and a second non-active area surrounded by the active area, and an optical hole is defined in the second non-active area through the substrate in a thickness direction; a first first sub constant voltage line disposed on the substrate and extended from the second non-active area in a first direction; a second first sub constant voltage line disposed on the substrate and extended from the second non-active area in a direction opposite to the first direction; a sub constant voltage connection line disposed on the substrate and connecting the first first sub constant voltage line with the second first sub constant voltage line in the second non-active area; a first first sub data line disposed on the substrate and extended from the second non-active area in the first direction; a second first sub data line disposed on the substrate and extended from the second non-active area in the direction opposite to the first direction; and a sub data connection line disposed on the substrate and connecting the first first sub data line with the second first sub data line in the second non-active area on the substrate. In such an embodiment, the sub data connection line is disposed in three or more different conductive layers, and the sub constant voltage connection line is disposed in a conductive layer different from a conductive layer, in which the sub data connection line is disposed, and insulated from the sub data connection line.

According to an embodiment of a display device according to the invention includes a substrate in which an active area and a non-active area are defined, where the non-active area includes a first non-active area positioned at an edge of the active area and a second non-active area surrounded by the active area; a first conductive layer including a first sub data connection line on the substrate; a second conductive layer including a second sub data connection line on the first conductive layer; a third conductive layer including a third sub data connection line on the second conductive layer; a fourth conductive layer including a fourth sub data connection line, a data line and a constant voltage line on the third conductive layer; and a fifth conductive layer including a sub constant voltage connection line on the fourth conductive layer. In such an embodiment, the constant voltage line includes a first first sub constant voltage line extended from the second non-active area in a first direction, and a second first sub constant voltage line extended from the second non-active area in a direction opposite to the first direction e, and the first first sub constant voltage line and the second first sub constant voltage line are connected with each other through the sub constant voltage line in the second non-active area.

In embodiments of the display device, interference between a connection line between data lines and a connection line between constant voltage lines may be minimized in the vicinity of an optical hole.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
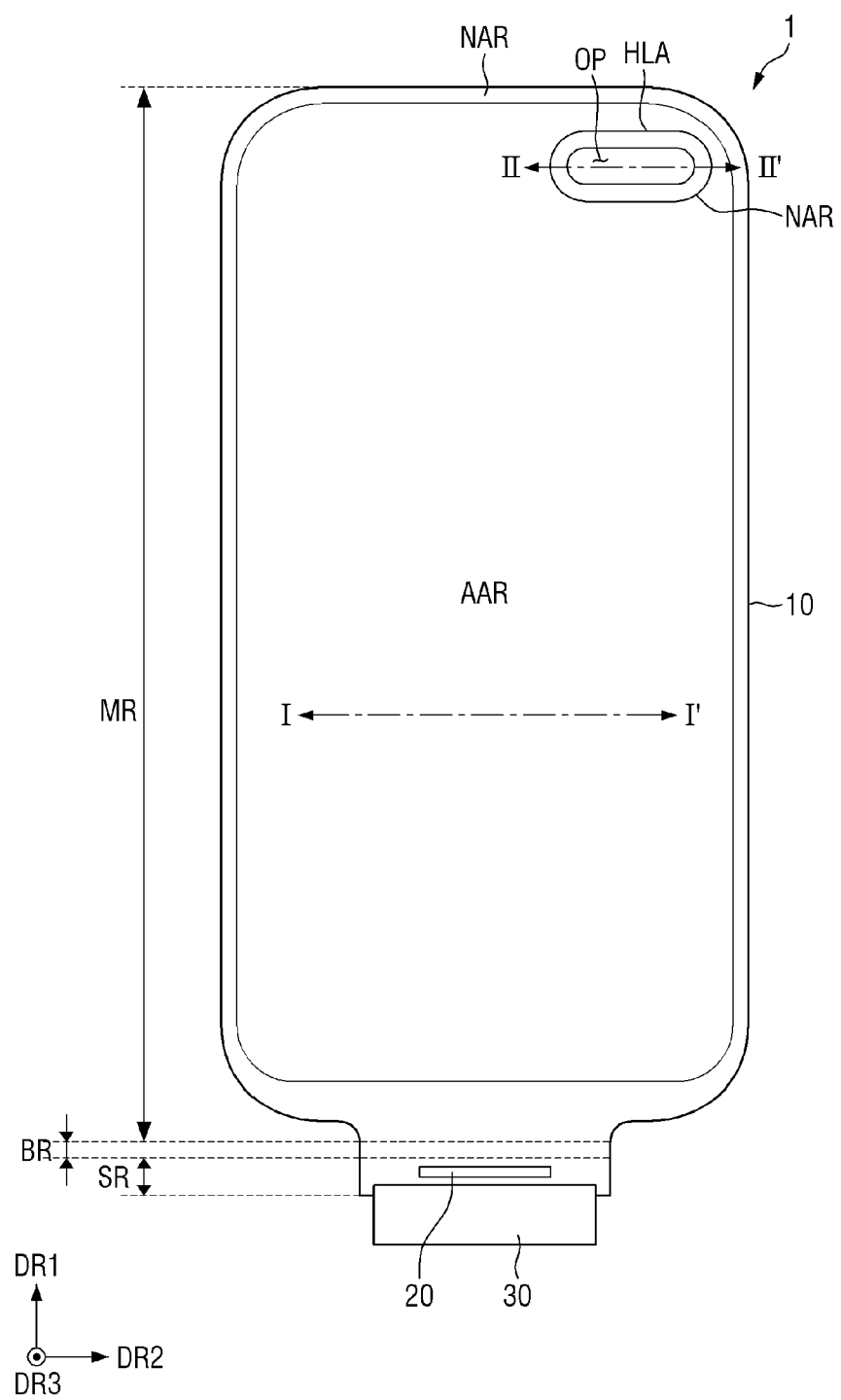
FIG. 1 is a plan view illustrating a display device according to one embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

Figure 2:
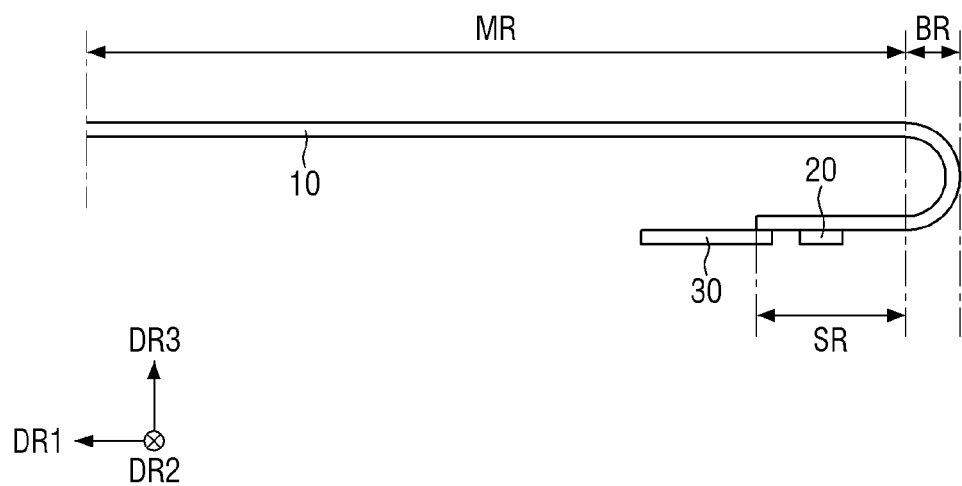
FIG. 2 is a side view of the display device of FIG. 1 in a bent state.

FIG. 1 is a plan view illustrating a display device according to one embodiment of the disclosure. FIG. 2 is a side view of the display device of FIG. 1 in a bent state. FIG. 1 shows a plane shape of the display device in a state in a flat state before the display device is bent. FIG. 2 shows a side shape of the display device in a state where the display device is bent in a thickness direction.

Herein, a first direction DR1 refers to a vertical direction on a plan view, and a second direction DR2 refers to a horizontal direction on a plan view as shown in the drawings. The first direction DR1 and the second direction DR2 cross each other. A third direction DR3 is a direction crossing both the first direction DR1 and the second direction DR2, and refers to a thickness direction of the display device (or display panel).

Referring to FIGS. 1 and 2, an embodiment of the display device 1 is a device that displays a moving image or a still image. The display device 1 may be used as a display screen of various products such as a television, a laptop computer, a monitor, a billboard, and a device for Internet of things ("IoT") as well as portable electronic devices such as a mobile phone, a smartphone, a tablet personal computer ("PC"), a smart watch, a watch phone, a mobile communication terminal, an electronic notebook, an electronic book, a navigation device, and an ultra mobile PC ("UMPC").

The display device 1 may include a display panel 10. In an embodiment, the display panel 10 may be a flexible substrate that includes a flexible polymer material such as polyimide. In such an embodiment, the display panel 10 may be curved, bent, folded or rolled.

The display panel 10 may include a display area AAR (or active area) for displaying an image and a non-display area NAR (or non-active area) for not displaying an image. The display panel 10 may be divided into the display area AAR and the non-display area NAR on a plan view. The non-display area NAR may be disposed to surround the display area AAR. The non-display area NAR may be positioned at an edge portion of the display area AAR on a plane. Here, the phrase "on a plane" may mean when viewed from a plan view in the third direction DR3. In an embodiment, for example, where the display area AAR has a rectangular shape with rounded corners, the non-display area NAR may be positioned at the edge portion of the display area AAR having a rectangular shape with rounded corners. The non-display area NAR may further be positioned in an area surrounded by the display area AAR on a plane. The non-display area NAR positioned at the edge portion of the display area AAR on the plane may be referred to as a first non-active area, and the non-display area NAR positioned in the area surrounded by the display area AAR on the plane may be referred to as a second non-active area. The non-display area NAR positioned in the area surrounded by the display area AAR on the plane may include an optical hole OP. The optical hole OP may be defined completely through the flexible substrate. Since the second non-active area includes the optical hole OP, the second non-active area may be referred to as a hole area HLA.

Figure 3:
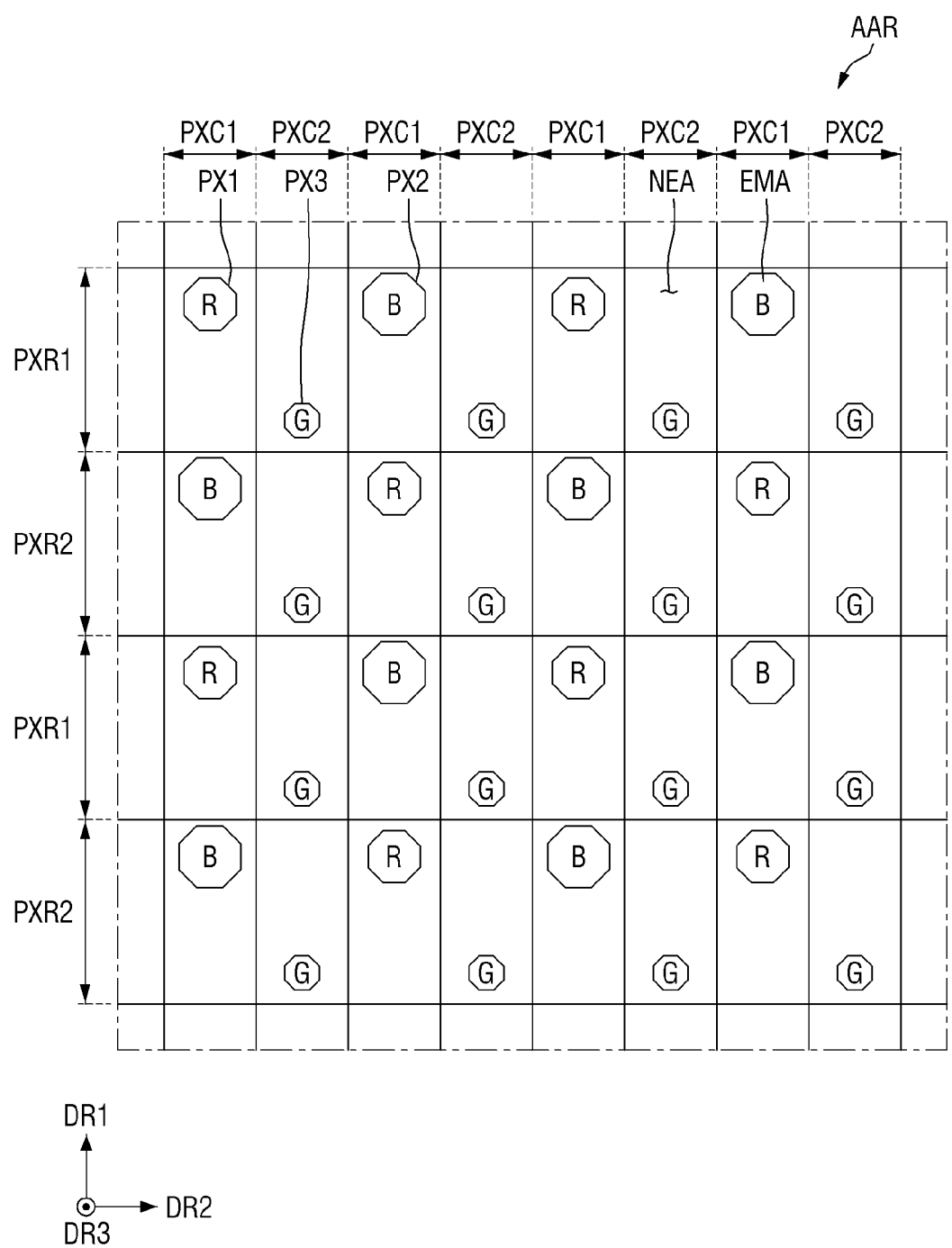
FIG. 3 is a plan view illustrating pixel arrangement of a display device according to one embodiment of the disclosure.

The display area AAR may include a plurality of pixels PX (PX1, PX2 and PX3, see FIG. 3). Each of the pixels PX1, PX2 and PX3 may be arranged in a matrix shape.

Each pixel may include a light-emitting layer (see EML of FIG. 5) and a circuit layer (see DRL of FIG. 5) controlling the amount of light emission of the light-emitting layer EML. The circuit layer DRL may include a line, an electrode, and at least one transistor. The light-emitting layer EML may include an organic light-emitting material. The light-emitting layer EML may be encapsulated by an encapsulation layer (see ENL of FIG. 5). Each of the pixels PX1, PX2 and PX3 will be described later in detail.

The display panel 10 may include a main area MR, and a bending area BR connected to one side of a first direction DR1 of the main area MR. The display panel 10 may further include a sub area SR connected with the bending area BR at one side of the first direction DR1 and bent in a thickness direction to overlap the main area MR in the thickness direction.

The main area MR may include the display area AAR. The non-display area NAR may be positioned at an edge portion in the vicinity of the display area AAR of the main area MR.

The main area MR may have a shape similar to an external shape on a plane of the display device 1. The main area MR may be a flat area positioned on one plane, but is not limited thereto. At least one of the other edges of the main area MR except an edge (side) connected with the bending area BR may be curved to form a curved surface, or may be bent in a vertical direction.

In an embodiment where at least one of the other edges of the main area MR except an edge (side) connected with the bending area BR is curved to form a curved surface or bent, the display area AAR may be disposed even in the corresponding edge. In an embodiment, the non-display area NAR for not displaying an image may be disposed in the curved surface or bent edge, or the display area AAR and the non-display area NAR may together be disposed therein, but is not limited thereto.

The non-display area NAR of the main area MR may be placed in an area from an outer boundary of the display area AAR to the edge of the display panel 10. Signal lines or driving circuits for applying a signal to the display area AAR may be disposed in the non-display area NAR of the main area MR.

The bending area BR may be connected with the main area MR through one short side of the main area MR. A width (width of a second direction DR2) of the bending area BR may be smaller than a width (width of a short side) of the main area MR. A connection portion of the main area MR and the bending area BR may have an L-shaped cutting shape to reduce a width of a bezel.

In the bending area BR, the display panel 10 may be bent with a curvature in an opposite direction of a display surface. In an embodiment, as the display panel 10 is bent from the bending area BR, the surface of the display panel 10 may be inverted. In such an embodiment, one surface of the display panel 10, which is oriented toward an upper portion, may be oriented toward the outside of a side through the bending area BR and then changed to be oriented toward a lower portion.

The sub area SR is extended from the bending area BR. The sub area SR may be extended in a direction parallel with the main area MR by starting from the time when bending is completed. The sub area SR may overlap the main area MR in a thickness direction of the display panel 10. The sub area SR may overlap the non-display area NAR of an edge of the main area MR, and may further overlap the display area AAR of the main area MR. A width of the sub area SR may be equal to that of the bending area BR, but is not limited thereto.

A pad portion (see 'PDR' of FIG. 8) may be disposed on the sub area SR of the display panel 10. An external device may be packaged in (or attached to) the pad portion PDR. In an embodiment, the external device may include a driving chip 20, and a driving substrate 30 including or made of a flexible printed circuit board or a hard printed circuit board, for example. In an embodiment, a line connection film, a connector, etc. may be packaged in the pad portion as the external device. A single external device may be packaged in the sub area SR, or a plurality of external devices may be packaged therein. In an embodiment, for example, as illustrated in FIGS. 1 and 2, the driving chip 20 may be disposed in the sub area SR of the display panel 10, and the driving substrate 30 may be attached to an end portion of the sub area SR. In such an embodiment, the display panel 10 may include both a pad portion connected with the driving chip 20 and a pad portion connected with the driving substrate 30. In an alternative embodiment, a driving chip may be packaged on a film, and the film may be attached to the sub area SR of the display panel 10.

The driving chip 20 is packaged on one surface of the display panel 10, which is the same surface as the display surface. In such an embodiment, as described above, where the driving chip 20 is packaged on the surface of the display panel 10, which is oriented toward the lower portion in a thickness direction, an upper surface of the driving chip 20 may be oriented toward the lower portion as the bending area BR is bent and inverted.

The driving chip 20 may be attached onto the display panel 10 through an anisotropic conductive film, or may be attached onto the display panel 10 through ultrasonic bonding. A horizontal width of the driving chip 20 may be smaller than that of the display panel 10. The driving chip 20 may be disposed at a center portion in a horizontal direction (second direction DR2) of the sub area SR, and a left edge and a right edge of the driving chip 20 may respectively be spaced apart from a left edge and a right edge of the sub area SR.

The driving chip 20 may include an integrated circuit for driving the display panel 10. In an embodiment, the integrated circuit may be, but not limited to, a data driving integrated circuit for generating and providing a data signal. The driving chip 20 is connected to a line pad (see 'DL_PD' of FIG. 8) provided in the pad portion PDR of the display panel 10 to provide a data signal to the line pad. Lines connected to the line pad DL_PD are extended toward the pixel (see PX of FIG. 3) to apply a data signal, etc. to each of the pixels PX1, PX2 and PX3.

FIG. 3 is a plan view illustrating pixel arrangement of a display device according to one embodiment of the disclosure.

Referring to FIG. 3, the pixels PX1, PX2 and PX3 may include a first color pixel PX1, a second color pixel PX2, and a third color pixel PX3. In an embodiment, the first color pixel PX1 may be a red pixel, the second color pixel PX2 may be a blue pixel, and the third color pixel PX3 may be a green pixel. The respective pixels PX1, PX2 and PX3 may alternately be arranged in a matrix form.

Each of the pixels PX1, PX2 and PX3 may include an emission area EMA and a non-emission area NEA surrounding the emission area EMA. Sizes of the emission areas EMA in the respective color pixels PX1, PX2 and PX3 may be different from one another. In an embodiment, for example, the emission area EMA of the second color pixel PX2 may be greater than the emission area EMA of the first color pixel PX1, and the emission area EMA of the third color pixel PX3 may be smaller than the emission area EMA of the first color pixel PX1. The emission area EMA of each pixel may have, but is not limited to, an octagonal shape. The emission area EMA of each pixel may have a hexagonal shape, a circular shape, a rhombus shape or other polygonal shape, a polygonal shape with rounded corners, etc.

In some pixel columns PXC (hereinafter, first pixel columns PXC1), the first color pixel PX1 and the second color pixel PX2 are alternately arranged along the first direction DR1 (column progress direction). In other pixel columns PXC (hereinafter, second pixel columns PXC2), the third color pixel PX3 is repeatedly arranged. The first pixel column PXC1 and the second pixel column PXC2 are alternately arranged along the second direction DR2 (row progress direction). In an embodiment, for example, odd numbered pixel columns PXC may be the first pixel columns PXC1, and even numbered pixel columns PXC may be the second pixel columns PXC2.

The respective emission areas EMA that belong to or collectively define one pixel column PXC may generally be aligned along the first direction DR1. The emission areas EMA of one pixel column PXC may be disposed to be alternate with respect to the emission areas EMA of another pixel column PXC adjacent thereto. In an embodiment, for example, the first color pixel PX1 and the second color pixel PX2 of the first pixel column PXC1 may be disposed to be aligned along the second direction DR2 between third color pixels PX3, which are adjacent to each other, of the second pixel column PXC2 adjacent thereto, and the third color pixel PX3 of the second pixel column PXC2 may be disposed to be aligned along the second direction DR2 between the first color pixel PX1 and the second color pixel PX2, which are adjacent to each other, of the first pixel column PXC1 adjacent thereto.

A pixel row PXR has a shape in which the first color pixel PX1 and the second color pixel PX2 are alternately arranged with the third color pixel PX3 interposed therebetween. A first pixel row PXR1 may have a repeated arrangement unit of the first color pixel PX1, the third color pixel PX3, the second color pixel PX2 and the third color pixel PX3, and a second pixel row PXR2 may have a repeated arrangement unit of the second color pixel PX2, the third color pixel PX3, the first color pixel PX1 and the third color pixel PX3. The first pixel row PXR1 and the second pixel row PXR2 are alternately arranged along the first direction DR1 (column progress direction). In an embodiment, for example, odd numbered pixel rows PXR may be the first pixel rows PXR1, and even numbered pixel rows PXR may be the second pixel rows PXR2. In one pixel row PXR, the emission area EMA of the first color pixel PX1 and the second color pixel PX2 may be disposed to be relatively more inclined toward the other side of the first direction DR1 than the emission area EMA of the third color pixel PX3. That is, in the pixel row PXR, the emission areas EMA of the respective pixels PX1, PX2 and PX3 may be arranged in a zigzag shape along the second direction DR2.

The pixels PX1, PX2 and PX3 that belong to a same column may receive a data signal from the same data line, and the pixels PX1, PX2 and PX3 that belong to a same row may receive a gate signal from the same gate line. Each of the pixels PX1, PX2 and PX3 may be driven by the pixel circuit. The circuit of the pixels PX1, PX2 and PX3 may include a plurality of transistors and at least one capacitor. A circuit view of an embodiment of an pixel circuit of the pixels PX1, PX2 and PX3 is shown in FIG. 4.

Figure 4:
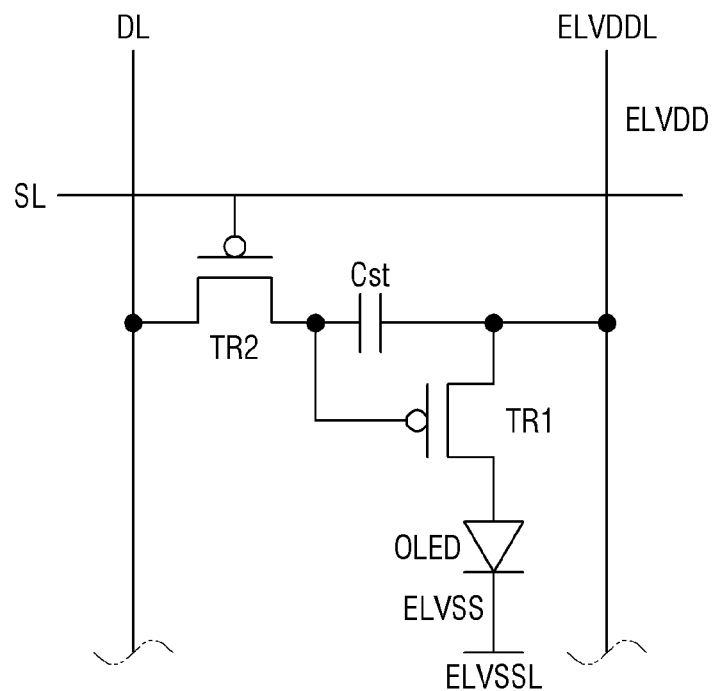
FIG. 4 is a circuit view illustrating one pixel of a display device according to one embodiment of the disclosure.

FIG. 4 is a circuit view illustrating one pixel of a display device according to one embodiment of the disclosure.

Referring to FIG. 4, in an embodiment, the pixel circuit may include a first transistor TR1, a second transistor TR2, a capacitor Cst, and an organic light-emitting diode OLED. In such an embodiment, a scan line SL, a data line DL, a first power voltage line ELVDDL and a second power voltage line ELVSSL are connected to each pixel circuit of the pixels PX1, PX2 and PX3.

The first transistor TR1 may be a driving transistor, and the second transistor TR2 may be a switching transistor. Although FIG. 4 shows an embodiment where the first transistor TR1 and the second transistor TR2 are P-channel metal-oxide-semiconductor ("PMOS") transistors, any one or both of the first transistor TR1 and the second transistor TR2 may be N-channel metal-oxide-semiconductor ("NMOS") transistor(s).

In such an embodiment, a first electrode (source electrode) of the first transistor TR1 is connected with the first power voltage line ELVDDL, and a second electrode (drain electrode) of the first transistor TR1 is connected to a pixel electrode (or anode electrode) of the organic light-emitting diode OLED. A first electrode (source electrode) of the second transistor TR2 is connected with the data line DL, and a second electrode (drain electrode) of the second transistor TR2 is connected to a gate electrode of the first transistor TR1. The capacitor Cst is connected between the gate electrode and the first electrode of the first transistor TR1. A common electrode (or cathode electrode) of the organic light-emitting diode OLED is connected with the second power voltage line ELVSSL, and is supplied with a second power voltage ELVSS from the second power voltage line ELVSSL. The second power voltage ELVSS may be a voltage lower than a first power voltage ELVDD supplied from the first power voltage line ELVDD.

The second transistor TR2 may output the data signal applied to the data line DL in response to a scan signal applied to the scan line SL. The capacitor Cst may charge a voltage corresponding to the data signal received from the second transistor TR2. The first transistor TR1 may control a driving current flowing in the organic light-emitting diode OLED in response to the amount of charges stored in the capacitor Cst.

FIG. 4 shows an equivalent circuit diagram of one embodiment of the pixel circuit, and the pixel circuit may be variously modified to include more transistors and capacitors (for example, seven).

Figure 5:
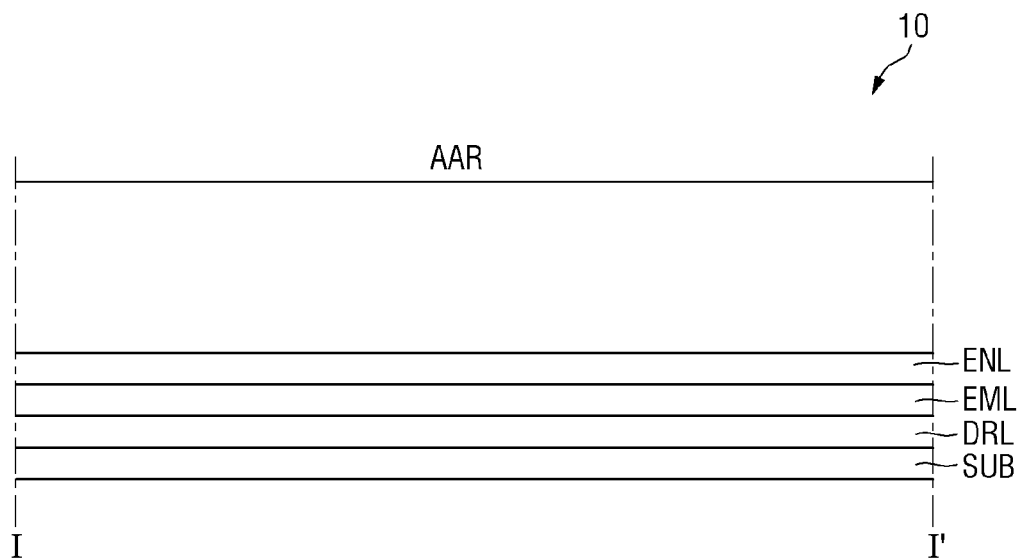
FIG. 5 is a cross-sectional view taken along line I-I' of FIG. 1.
Figure 6:
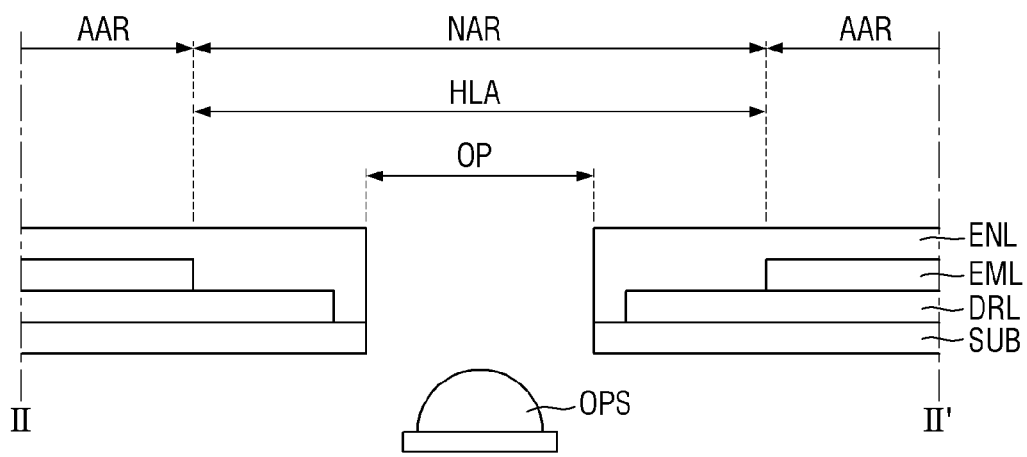
FIG. 6 is a cross-sectional view taken along line II-II' of FIG. 1.

FIG. 5 is a cross-sectional view taken along line I-I' of FIG. 1. FIG. 6 is a cross-sectional view taken along line II-II' of FIG. 1.

Referring to FIGS. 5 and 6, in an embodiment, the display area AAR of the display panel 10 may include a substrate portion SUB, a light-emitting layer EML on the substrate portion SUB, a circuit layer DRL for controlling the emission amount of the light-emitting layer EML between the light-emitting layer EML and the substrate portion SUB, and an encapsulation layer ENL on the light-emitting layer EML. The circuit layer DRL may include a line, an electrode, and at least one transistor. The light-emitting layer EML may include an organic light-emitting material. The light-emitting layer EML may be encapsulated by the encapsulation layer ENL. In an embodiment, the non-display area NAR positioned in an area surrounded by the hole area HLA (or display area AAR) of the display panel 10 may include the substrate portion SUB, the circuit layer DRL, and the encapsulation layer ENL as described above. The light-emitting layer EML of the display area AAR may not be disposed in the non-display area NAR. In an embodiment, a through hole OP may be defined in the hole area HLA may include. As shown in FIG. 6, the through hole OP may pass through the encapsulation layer ENL, the light-emitting layer EML, the circuit layer DRL, and the substrate portion SUB. The display device 1 may further include an optical element OPS including a light-receiving portion. In an embodiment, the optical element OPS including a light-receiving portion may include a camera, a lens (condensing lens or optical path guide lens), and an optical sensor such as an infrared sensor, an iris recognition sensor, an illumination sensor, or the like, for example. The optical element OPS may be disposed on the other surface of the display panel 10 to overlap the hole area HLA.

Figure 7:
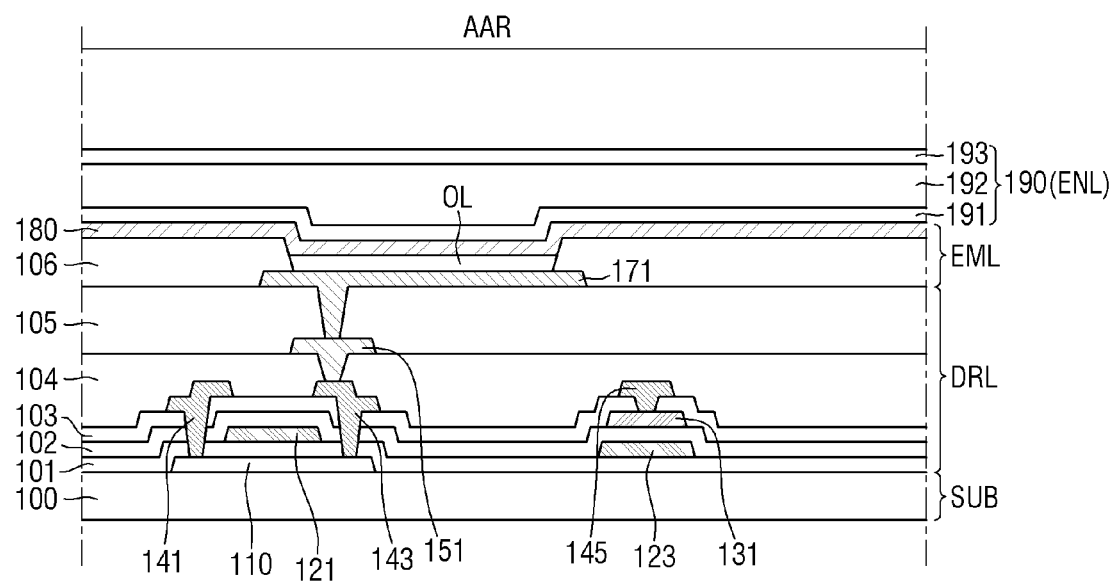
FIG. 7 is a detailed cross-sectional view illustrating a display panel of FIG. 5.

FIG. 7 is a detailed cross-sectional view illustrating the display panel of FIG. 5. In FIG. 7, the first transistor TR1 of two transistors of FIG. 4 is shown in the form of a thin film transistor, and the second transistor TR2 is omitted.

Referring to FIG. 7, an embodiment of the display panel (see 10 of FIG. 5) may include a substrate portion SUB, a circuit layer DRL, a light-emitting layer EML, and an encapsulation layer ENL. The substrate portion SUB may include a substrate 100. The circuit layer DRL may include a semiconductor layer 110, a first insulating layer 101, a first gate conductive layer 120, a second insulating layer 102, a second gate conductive layer 130, a third insulating layer 103, a first data conductive layer 140, a fourth insulating layer 104, a second data conductive layer 150, and a fifth insulating layer 105. The light-emitting layer EML may include a pixel electrode layer 170 including a pixel electrode 171, a pixel defining layer 106 including an opening for exposing the pixel electrode 171, an organic layer OL disposed in the opening of the pixel defining layer 106, and a common electrode 180 disposed on the organic layer OL and the pixel defining layer 106. The pixel electrode 171, the organic layer OL, and the common electrode 180 may constitute or collectively define a light-emitting element. The encapsulation layer ENL may include a first inorganic layer 191, an organic layer 192 on the first inorganic layer 191, and a second inorganic layer 103 on the organic layer 192. The aforementioned respective layers may include or be made of a single film, but may be made of a deposition film including a plurality of films. Another layer may further be disposed between the respective layers.

The substrate 100 supports the respective layers disposed thereon. The substrate 100 may include or be made of an insulating material such as a polymer resin. In an embodiment, for example, the polymer material may include polyethersulphone ("PES"), polyacrylate ("PA"), polyarylate ("PAR"), polyetherimide ("PEI"), polyethylene napthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP") or a combination thereof. The substrate 100 may be a flexible substrate that is able to be subjected to bending, folding, rolling, etc. In an embodiment, for example, a material constituting the flexible substrate may be, but not limited to, PI.

Although not shown, a buffer layer may be disposed on the substrate 100. The buffer layer may prevent impurity ions from being diffused and prevent water or external air from being permeated into the substrate 100, and may perform a surface planarization function. The buffer layer may include a silicon nitride, a silicon oxide or a silicon oxynitride. Alternatively, the buffer layer may be omitted depending on types or process conditions of the substrate 100.

The semiconductor layer 110 is disposed on the buffer layer 105. The semiconductor layer 110 constitutes a channel of a thin film transistor of the pixels PX1, PX2 and PX3. The semiconductor layer 110 may include polycrystalline silicon but is not limited thereto. The semiconductor layer 110 may include a single crystal silicon, a low temperature polycrystalline silicon, an amorphous silicon, or an oxide semiconductor. The oxide semiconductor may include, for example, a two-component compound (ABx), a three-component compound (ABxCy), or a four-component compound (ABxCyDz), which contains indium, zinc, gallium, tin, titanium, aluminum, hafnium (Hf), zirconium (Zr), magnesium (Mg), etc.

The first insulating layer 101 may be a gate insulating film having a gate insulating function. The first insulating layer 101 may include a silicon compound, a metal oxide, etc. In an embodiment, for example, the first insulating layer 101 may include at least one selected from a silicon oxide, a silicon nitride, a silicon oxynitride, an aluminum oxide, a tantalum oxide, a hafnium oxide, a zirconium oxide, and a titanium oxide. These oxides may be used alone or by combination. The first insulating layer 101 may be a single film, or a multi-layered film including or made of deposition films of different materials from each other.

The first insulating layer 101 is disposed on the semiconductor layer 110. The first insulating layer 101 may generally be disposed over an entire surface of the substrate 100.

The first gate conductive layer 120 is disposed on the first insulating layer 101. The first gate conductive layer 120 may include a gate electrode 121 of the thin film transistor of the pixels PX1, PX2 and PX3, a scan line connected to the gate electrode 121, and a sustain capacitor first electrode 123.

The first gate conductive layer 120 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first gate conductive layer 120 may be a single film or a multi-layered film.

The second insulating layer 102 may be disposed on the first gate conductive layer 120. The second insulating layer 102 may be an inter-layer dielectric film or a gate insulating film. The second insulating layer 102 may include an inorganic insulating material such as a silicon oxide, a silicon nitride, a silicon oxynitride, a hafnium oxide, an aluminum oxide, a titanium oxide, a tantalum oxide, or a zinc oxide.

The second gate conductive layer 130 is disposed on the second insulating layer 102. The second gate conductive layer 130 may include a sustain capacitor second electrode 131.

The second gate conductive layer 130 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second gate conductive layer 130 may include or be made of a same material as that of the first gate conductive layer 120 but is not limited thereto. The second gate conductive layer 130 may be a single film or a multi-layered film.

The third insulating layer 103 is disposed on the second gate conductive layer 130. The third insulating layer 103 may be an inter-layer dielectric film. The third insulating layer 103 may include an inorganic insulating material such as a silicon oxide, a silicon nitride, a silicon oxynitride, a hafnium oxide, an aluminum oxide, a titanium oxide, a tantalum oxide, and a zinc oxide, or an organic insulating material such as polyacrylates resin, epoxy resin, phenolic resin, polyamides resin, polyimides resin, unsaturated polyesters resin, poly phenylenethers resin, polyphenylenesulfides resin or benzocyclobutene ("BCB"). The third insulating layer 103 may be a single film, or a multi-layered film including or made of deposition films of different materials from each other.

The first data conductive layer 140 is disposed on the third insulating layer 103. The first data conductive layer 140 may be a first source/drain conductive layer. The first data conductive layer 140 may include a first electrode 141 and a second electrode 143 of the thin film transistor of the pixels PX1, PX2 and PX3. The first electrode 141 and the second electrode 143 of the thin film transistor may electrically be connected with a source area and a drain area of the semiconductor layer 110 through a contact hole defined through the third insulating layer 103, the second insulating layer 102 and the first insulating layer 101. A first power voltage electrode 145 of the pixels PX1, PX2 and PX3 may also be included in or defined by the first data conductive layer 140.

The first data conductive layer 140 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first data conductive layer 140 may be a single film or a multi-layered film. In an embodiment, for example, the first data conductive layer 140 may have a deposition structure of Ti/Al/Ti, Mo/Al/Mo, Mo/AlGe/Mo, Ti/Cu, etc.

The fourth insulating layer 104 is disposed on the first data conductive layer 140. The fourth insulating layer 104 covers the first data conductive layer 140. The fourth insulating layer 104 may be an inter-layer dielectric layer or a via layer. The fourth insulating layer 104 may include an organic insulating material such as polyacrylates resin, epoxy resin, phenolic resin, polyamides resin, polyimides resin, unsaturated polyesters resin, poly phenylenethers resin, polyphenylenesulfides resin or BCB.

The second data conductive layer 150 is disposed on the fourth insulating layer 104. The second data conductive layer 150 may be a second source/drain conductive layer. The second data conductive layer 150 may include an anode connection electrode 151 of the pixels PX1, PX2 and PX3. The anode connection electrode 151 may electrically be connected with the second electrode 143 of the thin film transistor of the pixels PX1, PX2 and PX3 through a contact hole defined through the fourth insulating layer 104.

The second data conductive layer 150 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second data conductive layer 150 may be a single film or a multi-layered film. In an embodiment, for example, the second data conductive layer 150 may include or be formed of, but not limited to, a same material as that of the first conductive layer 140.

The fifth insulating layer 105 is disposed on the second data conductive layer 150. The fifth insulating layer 105 covers the second data conductive layer 150. The fifth insulating layer 105 may be a via layer. The fifth insulating layer 105 may include a same material as that of the fourth insulating layer 104, or may include at least one material selected from the above listed materials of the fourth insulating layer 104.

A pixel electrode layer 170 may be disposed on the fifth insulating layer 105. The pixel electrode layer 170 may include a pixel electrode 171. The pixel electrode 171 may be an anode electrode of the light-emitting element. The pixel electrode 171 may electrically be connected with the anode connection electrode 151 defined by the second data conductive layer 150 through a contact hole defined through the fifth insulating layer 105, and may be connected with the second electrode 143 of the thin film transistor through the anode connection electrode 151.

The pixel electrode 171 may have, but is not limited to, a deposition film structure of a material layer having a high work function such as indium-tin-oxide ("ITO"), indium-zinc-oxide ("IZO"), zinc oxide (ZnO), and indium oxide ($In_2O_3$) and a reflective material layer such as Ag, Mg, Al, Pt, Pb, Au, Ni, Nd, Ir, Cr, Li, Ca or a compound thereof. The material layer having a high work function may be disposed to be higher than the reflective material layer and thus disposed to be close to the organic layer OL. The pixel electrode 171 may have a multi-layered structure of ITO/Mg, ITO/MgF, ITO/Ag, and ITO/Ag/ITO, but is not limited thereto.

The pixel defining layer 106 may be disposed on the pixel electrode 171. The pixel defining layer 106 may partially overlap the non-emission area NEA of the pixels PX1, PX2 and PX3. An opening may be defined through the pixel defining layer 106 to expose the pixel electrode 171. The pixel defining layer 106 may include an inorganic insulating material such as a silicon oxide, a silicon nitride, a silicon oxynitride, a hafnium oxide, an aluminum oxide, a titanium oxide, a tantalum oxide, and a zinc oxide, or an organic insulating material such as polyacrylates resin, epoxy resin, phenolic resin, polyamides resin, polyimides resin, unsaturated polyesters resin, poly phenylenethers resin, polyphenylenesulfides resin or BCB. The pixel defining layer 106 may be a single film, or a multi-layered film including or made of deposition films of different materials from each other.

The organic layer OL is disposed in the opening of the pixel defining layer 106. The organic layer OL may include or be made of an inorganic material or an organic material. In an embodiment, the organic layer OL may include an organic layer. The organic layer OL may include an organic light-emitting layer, a hole injecting/transporting layer, and an electron injecting/transporting layer. The organic layer OL may overlap the emission area EMA.

The common electrode 180 is disposed on the organic layer OL and the pixel defining layer 106. The common electrode 180 may be a cathode electrode of the light-emitting element. The common electrode 180 may be disposed in the non-emission area NEA as well as the emission area EMA of the pixels PX1, PX2 and PX3. In an embodiment, the common electrode 180 may be disposed on an entire surface of each of the pixels PX1, PX2 and PX3. The common electrode 180 may include a material layer having a low work function such as Li, Ca, LiF/Ca, LiF/Al, Al, Mg, Ag, Pt, Pd, Ni, Au Nd, Ir, Cr, BaF, Ba or a compound or mixture thereof (for example, a mixture of Ag and Mg). The common electrode 180 may further include a transparent metal oxide layer disposed on the material layer having a low work function.

An encapsulation layer (ENL) 190 may be disposed on the common electrode 180. The encapsulation layer 190 may include at least one inorganic layer and an inorganic layer. In an embodiment, the encapsulation layer 190 may include a first inorganic layer 191, an organic layer 192 on the first inorganic layer 191, and a second inorganic layer 193 on the organic layer 192.

Figure 8:
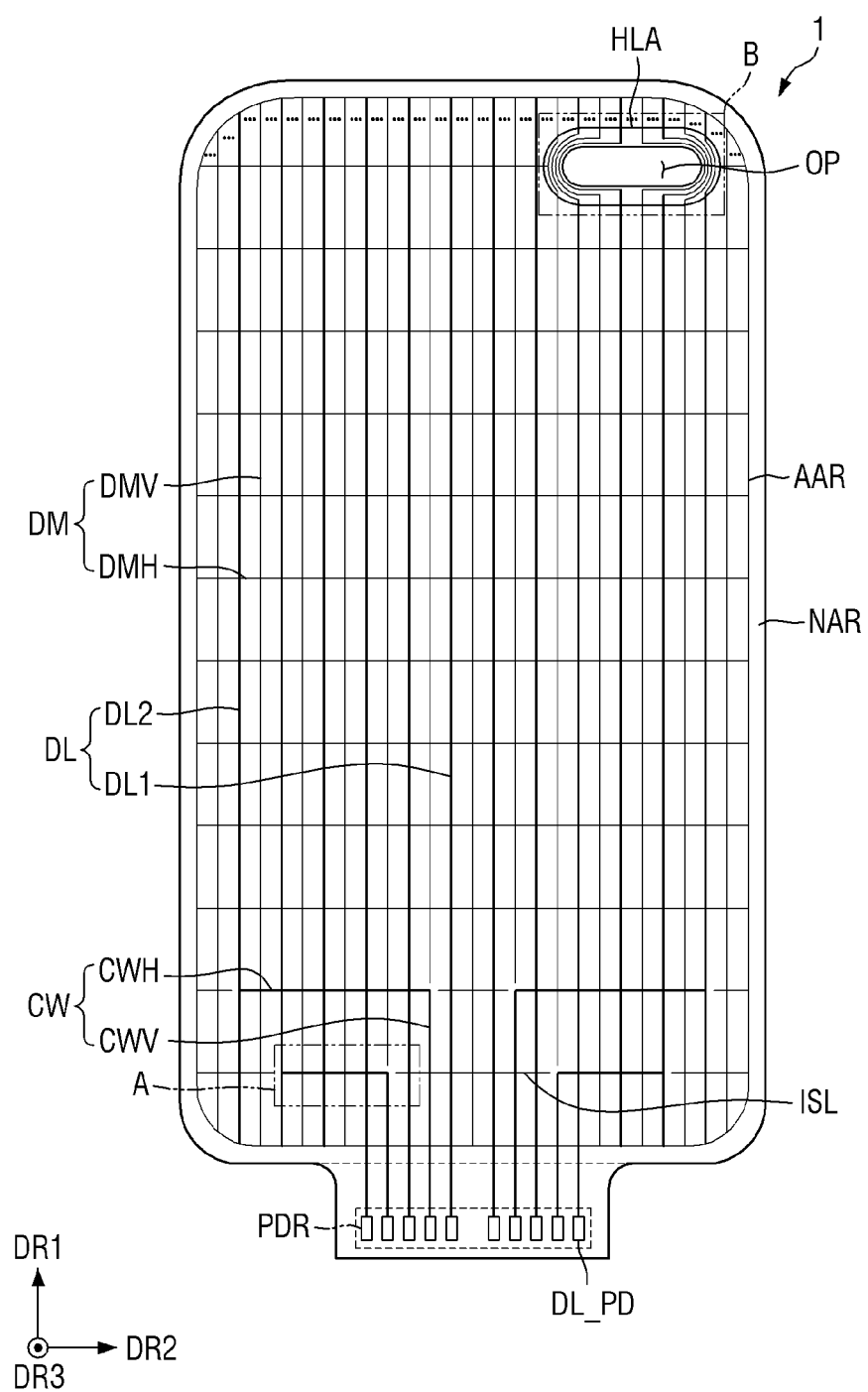
FIG. 8 is a schematic plan view illustrating a data line, a connection line and a constant voltage of a display device line according to one embodiment of the disclosure.
Figure 9:
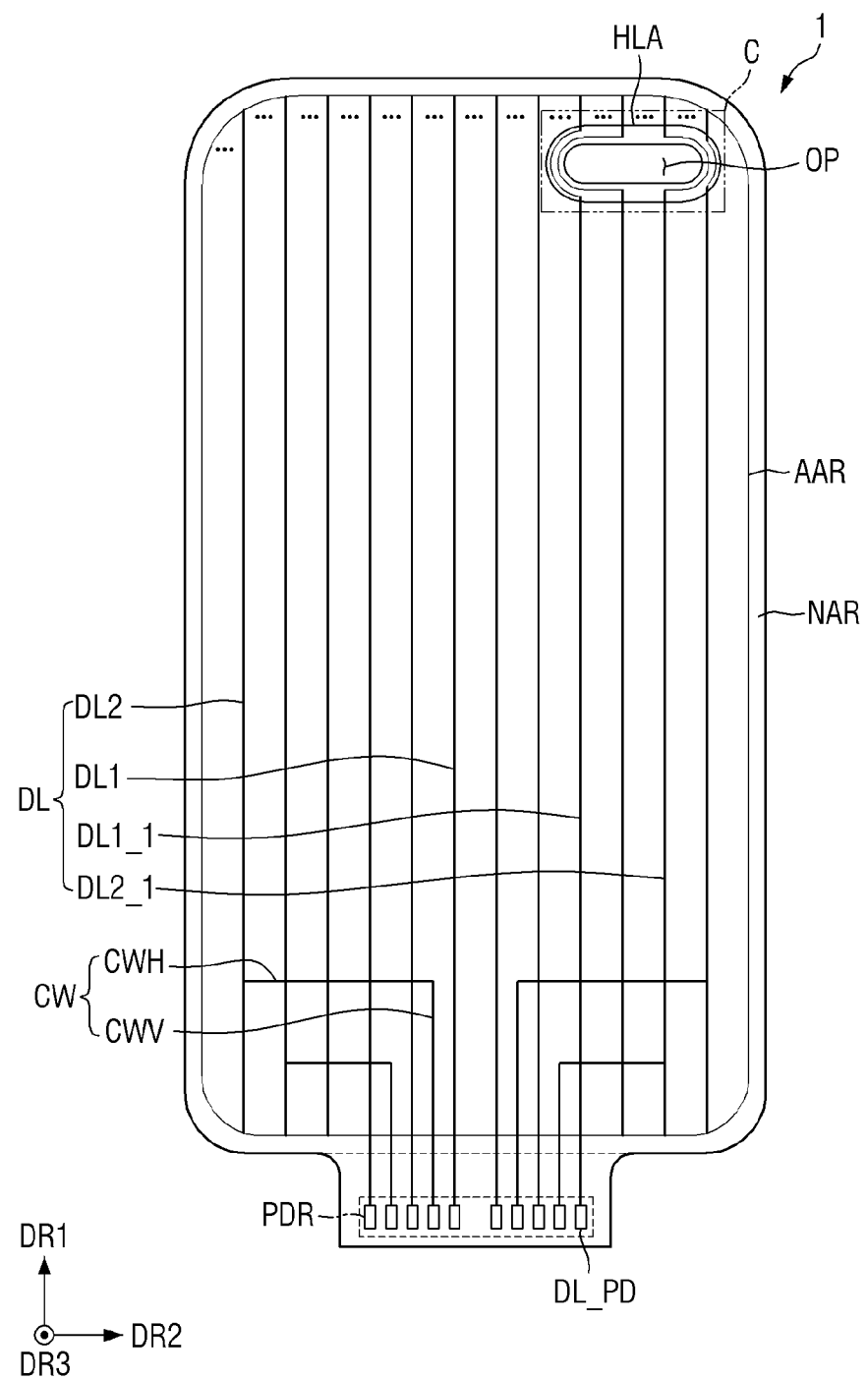
FIG. 9 is a schematic plan view illustrating the data line and the connection line of FIG. 8.
Figure 10:
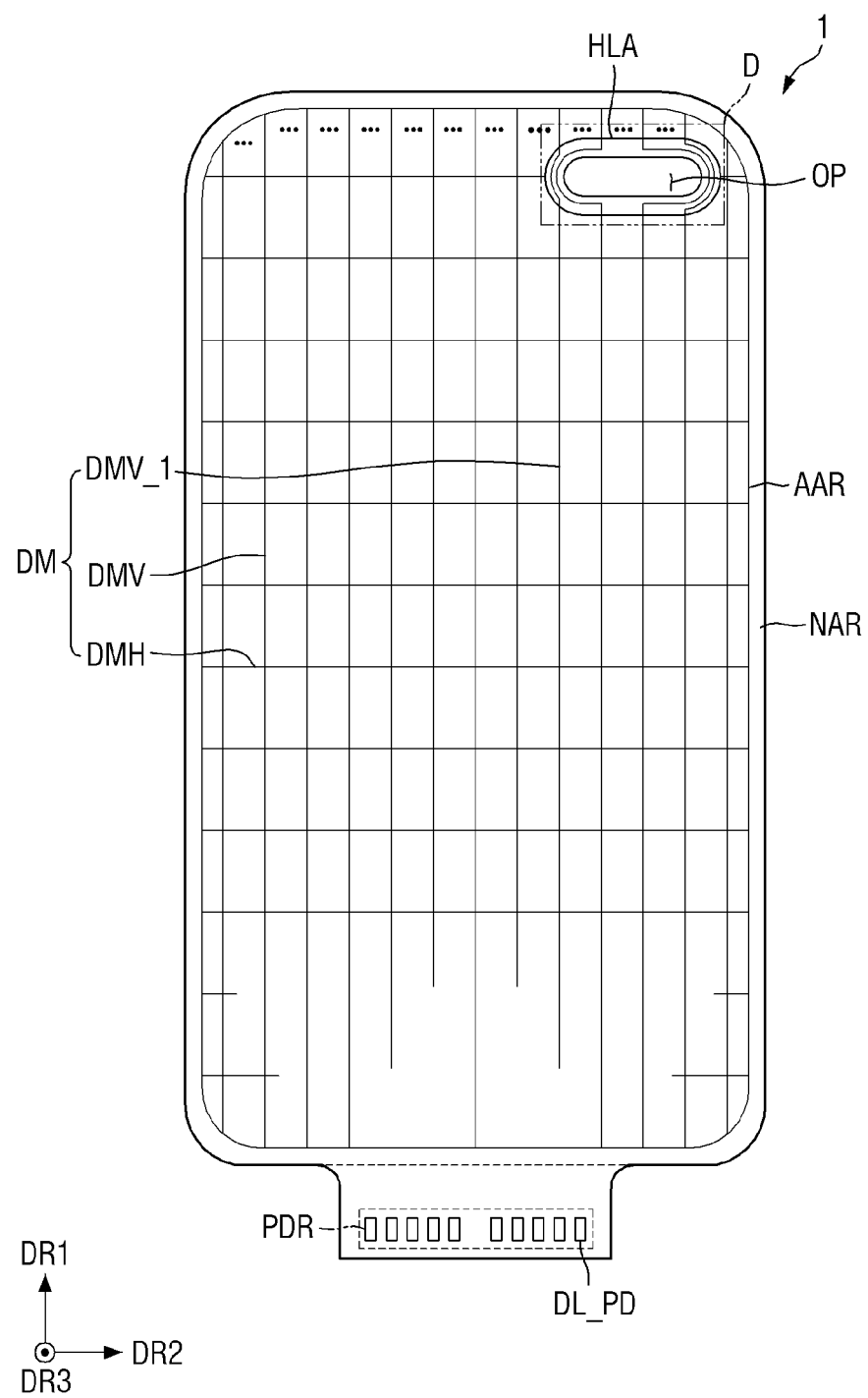
FIG. 10 is a schematic plan view illustrating the constant voltage line of FIG. 8.
Figure 11:
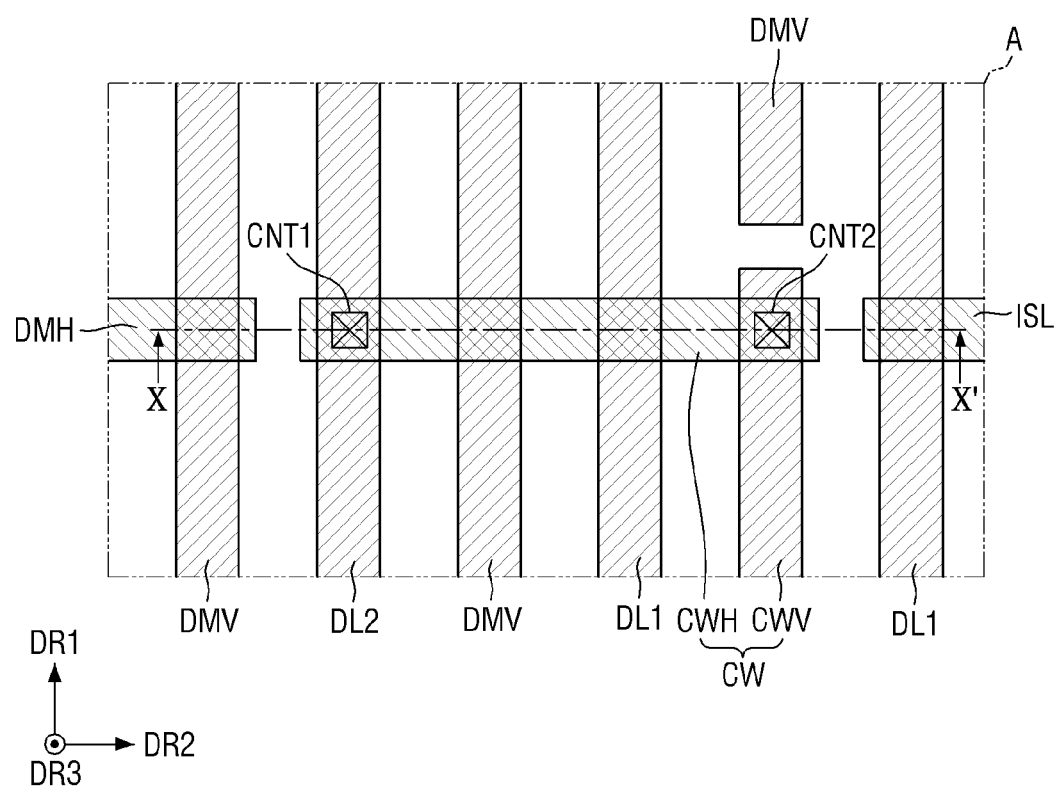
FIG. 11 is an enlarged plan view illustrating an area A of FIG. 8.
Figure 12:
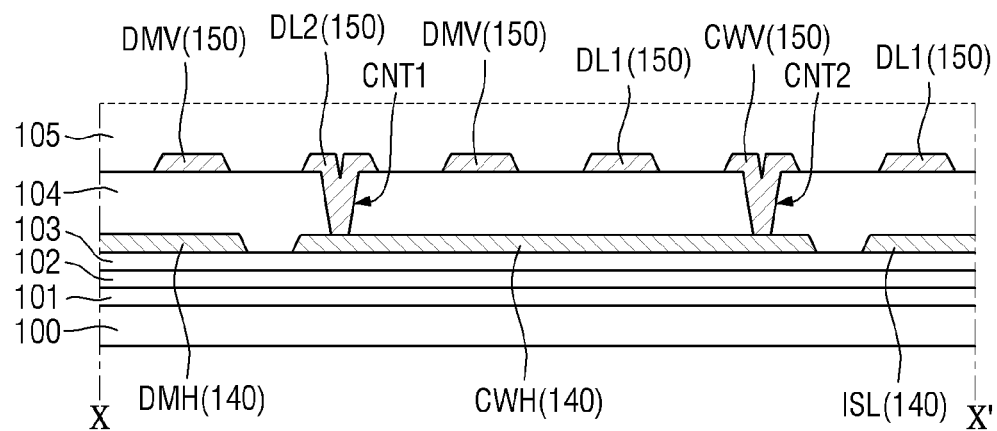
FIG. 12 is a cross-sectional view taken along line X-X' of FIG. 11.

FIG. 8 is a schematic plan view illustrating a data line, a connection line and a constant voltage of a display device line according to one embodiment of the disclosure. FIG. 9 is a schematic plan view illustrating the data line and the connection line of FIG. 8. FIG. 10 is a schematic plan view illustrating the constant voltage line of FIG. 8. FIG. 11 is an enlarged plan view illustrating an area A of FIG. 8. FIG. 12 is a cross-sectional view taken along line X-X' of FIG. 11.

Referring to FIGS. 8 to 12, an embodiment of the display panel 10 may include data lines DL respectively extended in the first direction DR1 and arranged along the second direction DR2, a connection line CW electrically connected with the data lines DL and a line pad DL_PD of the pad portion PDR, and a constant voltage line DM to which a constant voltage is applied. The data line DL may be defined by the second conductive layer 150.

The data lines DL may include a first data line DL1 and a second data line DL2. Each of the first data line DL1 and the second data line DL2 may be provided in plural. The first data line DL1 may directly be connected with the line pad DL_PD of the pad portion PDR, and the second data line DL2 may electrically be connected with the line pad DL_PD of the pad portion PDR through the connection line CW. Although not limited thereto, based on the second direction DR2, the first data line DL1 may be disposed in the vicinity of the center of the display device 1, and the second data line DL2 may be disposed outside the display device 1. In an embodiment, for example, the first data line DL1 may be extended from the line pad DL_PD of the pad portion PDR in the first direction DR1, and the second data line DL2 may be disposed at one side and the other side of the second direction DR2 of the first data line DL1.

The connection line CW may be disposed between the second data line DL2 and the line pad DL_PD of the pad portion PDR. The connection line CW may be provided in plural. Each of the plurality of connection lines CW may include a first connection line CWV extended in the first direction DR1 and a second connection line CWH extended in the second direction DR2. The first connection line CWV and the second connection line CWH of each of the plurality of connection lines CW may electrically be connected with each other. An end at one side of the first connection line CWV may electrically be connected with the line pad DL_PD of the pad portion PDR, and an end at the other side of the first connection line CWV may electrically be connected with the second connection line CWH. An end at one side of the second connection line CWH may electrically be connected with the first connection line CWV, and an end at the other side of the second connection line CWH may electrically be connected with the second data line DL2. In such an embodiment, the second data line DL2 may electrically be connected with the line pad DL_PD of the pad portion PDR through the connection line CW.

The first connection line CWV and the second connection line CWH may be defined by respective conductive layers different from each other. In an embodiment, for example, the first connection line CWV may be defined by the second data conductive layer 150, and the second connection line CWH may be defined by the first data conductive layer 140, but the connection lines are not limited thereto. In an embodiment, even though the second connection line CWH crosses the data line DL, the second connection line CWH and the data line DL may electrically be insulated from each other through the fourth insulating layer 104.

Even though the first connection line CWV and the second connection line CWH are defined by respective conductive layers different from each other, the first connection line CWV and the second connection line CWH may electrically be connected with each other through a contact hole CNT2 defined through the fourth insulating layer 104.

Even though the first connection line CWV and the second connection line CWH are defined by respective conductive layers different from each other, the first connection line CWV and the second data line DL2 may electrically be connected with each other through a contact hole CNT1 defined through the fourth insulating layer 104.

At least a portion of the connection line CW may be disposed in the display area AAR. The portion (contact hole CNT1) where the second data line DL2 and the connection line CW are electrically connected with each other may be disposed in the display area AAR. At least a portion of the connection line CW for electrically connecting the line pad DL_PD of the pad portion PDR with the second data line DL2 may be disposed in the display area AAR. As the connection line CW does not bypass the non-display area NAR and at least a portion of the connection line CW is disposed in the display area AAR, a width of the non-display area NAR may be reduced, whereby a user may be supplied with more improved immersion, and the other lines may be disposed in the non-display area NAR more easily.

In an alternative embodiment, the connection line CW and the second data line DL2 may be in contact with each other in the non-display area NAR, and thus may electrically be connected with each other. In such an embodiment, a separate conductive pattern for electrically connecting the connection line CW with the second data line DL2 may further be disposed in the non-display area NAR.

In an embodiment, the display device 1 may further include a separation pattern ISL. The separation pattern ISL may be separated from the connection line CW and the constant voltage line DM, and may electrically be insulated therefrom. The separation pattern ISL may include an island shape. The separation pattern ISL may be extended in the second direction DR2, and may be disposed between the connection lines CW. The separation pattern ISL may be disposed between the second connection lines CWH adjacent to each other in the second direction DR2, and may be disposed on an extension line of the second connection line CWH. The separation pattern ISL may be defined by the first data conductive layer 140.

The constant voltage line DM may include a first constant voltage line DMV extended in the first direction DR1 and a second constant voltage line DMH extended in the second direction DR2. Each of the first constant voltage line DMV and the second constant voltage line DMH may be provided in plural, and the plurality of first constant voltage lines DMV may be arranged in the second direction DR2, and the plurality of second constant voltage lines DMH may be arranged in the first direction DR1.

The constant voltage line DM may be separated or spaced apart from the connection line CW and the data line DL, and may electrically be insulated therefrom. The constant voltage line DM may be extended in the same direction as that of the connection line CW, or may be disposed to be placed on the extension line of the connection line CW. In such an embodiment, at least a portion of the plurality of first constant voltage lines DMV may be extended in the first direction DR1 along which the first connection line CWV is extended, and may be disposed to be placed on the extension line of the first connection line CWV. At least a portion of the plurality of second constant voltage lines DMH may be extended in the second direction DR2 along which the second connection line CWH is extended, and may be disposed to be placed on the extension line of the second connection line CWH.

The first constant voltage line DMV disposed on the extension line of the first connection line CWV may be separated or spaced apart from the first connection line CWV, and may electrically be insulated therefrom. At least a portion of the plurality of second constant voltage lines DMH may be extended in the second direction DR2 along which the second connection line CWH is extended, and may be disposed to be placed on the extension line of the second connection line CWH. The second constant voltage line DMH disposed on the extension line of the second connection line CWH may be separated or spaced apart from the second connection line CWH, and may electrically be insulated therefrom.

In an embodiment where the first constant voltage line DMV is disposed on the extension line of the first connection line CWV, a length of the first constant voltage line DMV may be variously determined based on a length of the first connection line CWV. In an embodiment, for example, the length of the first constant voltage line DMV positioned on the extension line of the first connection line CWV of which length is relatively short may be relatively long. In an embodiment where the second constant voltage line DMH is disposed on the extension line of the second connection line CWH, the second constant voltage lines DMH separated from each other may be positioned on the extension line of one second connection line CWH. In such an embodiment, the second connection line CWH may be positioned between the second constant voltage lines DMH separated from each other. In such an embodiment, the length of the second constant voltage line DMH may be variously determined based on the length of the second connection line CWH. In an embodiment, for example, the length of the second constant voltage line DMH positioned on the extension line of the second connection line CWH of which length is relatively short may be relatively long.

The first constant voltage line DMV and the second constant voltage line DMH may be defined by respective conductive layers different from each other. The first constant voltage line DMV may be defined by a same conductive layer as that of the first connection line CWS, and the second constant voltage line DMH may be defined by a same conductive layer as that of the second connection line CWH. In an embodiment, for example, the first constant voltage line DMV may be made of the second data conductive layer 150 and the second constant voltage line DMH may be defined by the first data conductive layer 140, but these voltage lines are not limited thereto. In an embodiment, even though the second constant voltage line DMH crosses the data line DL and/or the first constant voltage line DMV, the second constant voltage line DMH and the data line DL and/or the first constant voltage line DMV may electrically be insulated from each other through the fourth insulating layer 104.

In an embodiment, the first constant voltage line DMV may be disposed in or directly on a same layer as the first connection line CWV, and the second constant voltage line DMH may be disposed in or directly on a same layer as the second connection line CWH. In an embodiment, for example, the first constant voltage line DMV may be disposed directly on the third insulating layer 103 together with the first connection line CWV, and the second constant voltage line DMH may be disposed directly on the fourth insulating layer 104 together with the second connection line CWH. However, the constant voltage lines are not limited thereto.

The display device 1 may further include a mesh pattern in the display area AAR. The mesh pattern may include the constant voltage line DM and the connection line CW. In an embodiment, the constant voltage line DM and the connection line CW may constitute the mesh pattern over the entire area of the display area AAR. In the display area AAR, the constant voltage line DM is disposed on the area in which the connection line CW is not disposed, whereby the mesh pattern may be disposed over the entire area of the display area AAR. Therefore, the connection line CW may be suppressed or prevented from being visible in the display area AAR.

A constant voltage may be applied to the constant voltage line DM. The constant voltage may be at least one of the first power voltage ELVDD (see FIG. 4) or the second power voltage ELVSS (see FIG. 4). In an embodiment, different constant voltages may be applied to respective areas of the constant voltage line DM. In such an embodiment, two areas to which respective constant voltages different from each other are applied may electrically be insulated from each other.

When the second power voltage ELVSS (see FIG. 4) is applied to the constant voltage line DM, a current of the second power voltage line ELVSSL (see FIG. 4) may be dispersed, and heat emission of the second power voltage line ELVSSL (see FIG. 4) may be suppressed or prevented from occurring. In such an embodiment, voltage drop (IR drop) of a driving voltage may be suppressed or prevented from occurring, such that the display device 1 may be driven more actively.

In an embodiment, the display device 1 may further include a sub constant voltage line DMV_1 including a first first sub constant voltage line DMV_1a extended from the second non-active area to one side of the first direction DR1 on a plane on the substrate 100 and a second first sub constant voltage line DMV_1b extended from the second non-active area to the other side of the first direction DR1 on the plane on the substrate 100, and a sub constant voltage connection line CW_O_DMV for connecting the first first sub constant voltage line DMV_1a with the second first sub constant voltage line DMV_1b in the second non-active area on the substrate 100. The sub constant voltage line DMV_1 may constitute a constant voltage line DM.

The sub constant voltage line DMV_1 may be extended generally along the first direction DR1 in the display area AAR, and may be positioned in a same layer with a same function as that of the first constant voltage line DMV of the constant voltage line DM in the hole area HLA except that the sub constant voltage line DMV_1 is connected with the sub constant voltage connection line CW_O_DMV.

In an embodiment, the display device 1 may include a first sub data line DL1_1 including a first first sub data line DL1_1a extended from the second non-active area to one side of the first direction DR1 on the plane on the substrate 100 and a second first sub data line DL1_1b extended from the second non-active area to the other side of the first direction DR1 on the plane on the substrate 100, and a first sub data connection line for connecting the first first sub data line DL1_1a with the second first sub data line DL1_1b in the second non-active area on the substrate 100.

The first sub data line DL1_1 may be extended generally along the first direction DR1 in the display area AAR, and may be positioned in a same layer with the same function as that of the first data line DL1 in the hole area HLA except that the first sub data line DL1_1 is connected with the first sub data connection line.

Also, the display device 1 may include a second sub data line DL2_1 including a first second sub data line DL2_1a extended from the second non-active area to one side of the first direction DR1 on the plane on the substrate 100 and a second second sub data line DL2_1b extended from the second non-active area to the other side of the first direction DR1 on the plane on the substrate 100, and a second sub data connection line for connecting the first second sub data line DL2_1a with the second second sub data line DL2_1b in the second non-active area on the substrate 100.

The second sub data line DL2_1 may be extended generally along the first direction DR1 in the display area AAR, and may be positioned in a same layer with the same function as that of the second data line DL2 in the hole area HLA except that the second sub data line DL2_1 is connected with the second sub data connection line.

The first sub data connection line and the second sub data connection line may be positioned in three or more different conductive layers, respectively. In an embodiment, for example, the sub data connection lines may be disposed on the first gate conductive layer 120, the second gate conductive layer 130, the first data conductive layer 140, and the second data conductive layer 140, which are shown in FIG. 7.

In an embodiment, the sub constant voltage connection line CW_O_DMV may be positioned in a conductive layer different from that of each of the first sub data connection line and the second sub data connection line and then insulated therefrom. In an embodiment, for example, the sub constant voltage connection line CW_O_DMV may be disposed in the pixel electrode layer 170 of FIG. 7.

Since the circuit layer DRL is not disposed in the through hole OP, the first and second sub data connection lines may be disposed in an area of the hole area HLA except the through hole OP. Also, as described above, according to an embodiment, the first and second sub data connection lines are positioned in three or more different conductive layers, respectively, such that the arrangement density of the first and second sub data connection lines in the hole area HLA may be enhanced.

In an embodiment, the sub constant voltage connection lines CW_O_DMV may be disposed in an area of the hole area HLA except the through hole OP of the hole area HLA. However, as described above, since the first and second sub data connection lines are positioned in three or more different conductive layers, respectively, and the sub constant voltage connection line CW_O_DMV may be electrically insulated from the first and second sub data connection lines, the sub constant voltage connection line CW_O_DMV may be positioned in a conductive layer different from those of the first and second sub data connection lines. According to an embodiment of the disclosure, as the sub constant voltage connection line CW_O_DMV is positioned in the pixel electrode layer 170, the sub constant voltage connection line CW_O_DMV may be insulated from the first and second sub data connection lines in an area of the hole area HLA except the through hole OP of the hole area HLA.

Figure 13:
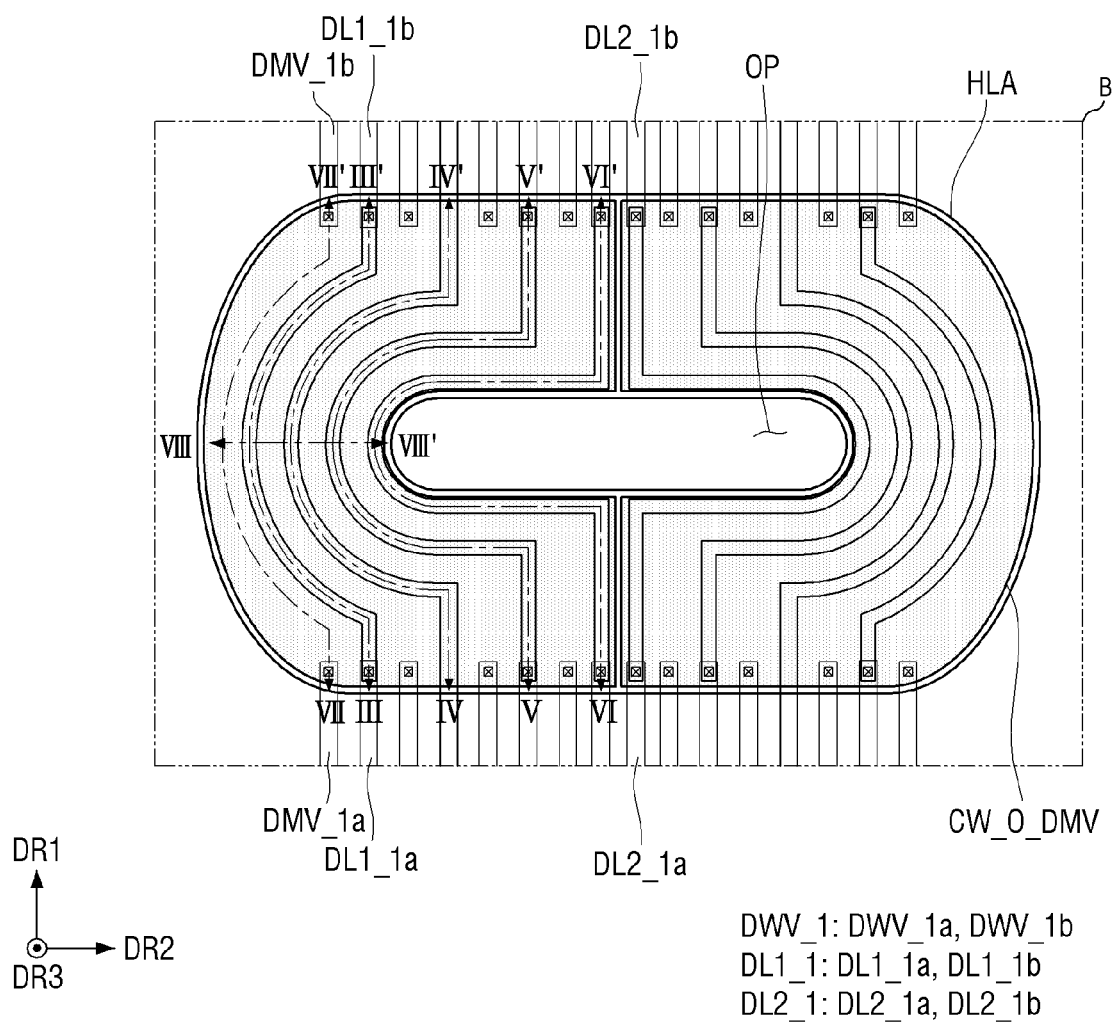
FIG. 13 is an enlarged plan view illustrating an area B of FIG. 8.
Figure 14:
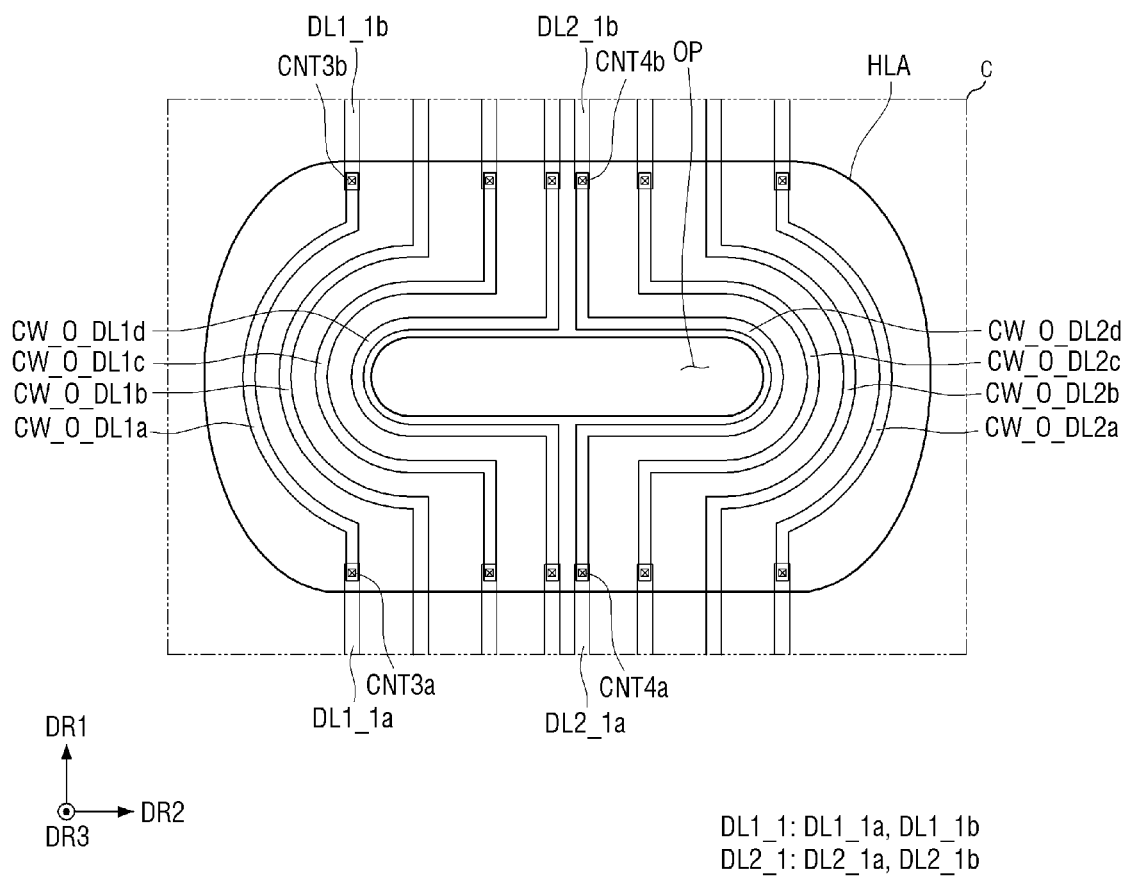
FIG. 14 is an enlarged plan view illustrating an area C of FIG. 9.
Figure 15:
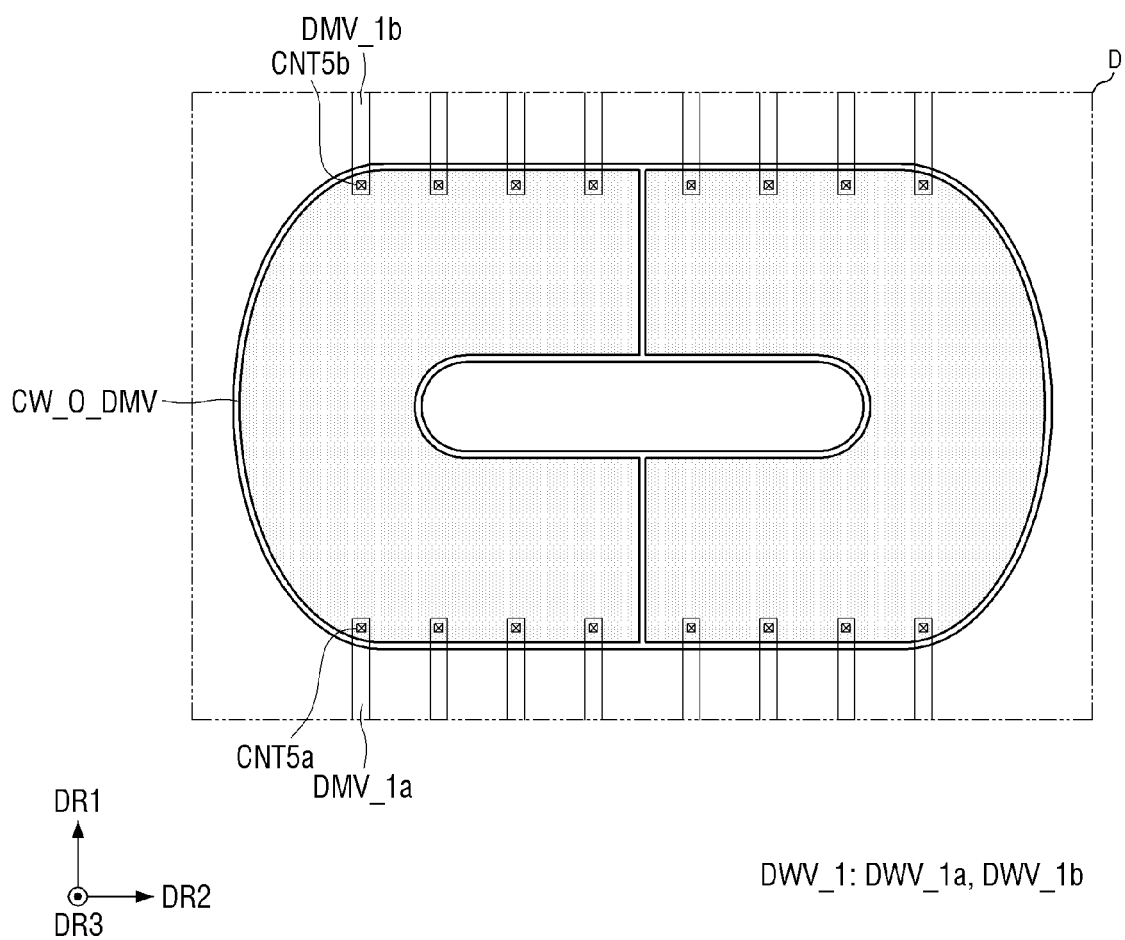
FIG. 15 is an enlarged plan view illustrating an area D of FIG. 10.
Figure 16:
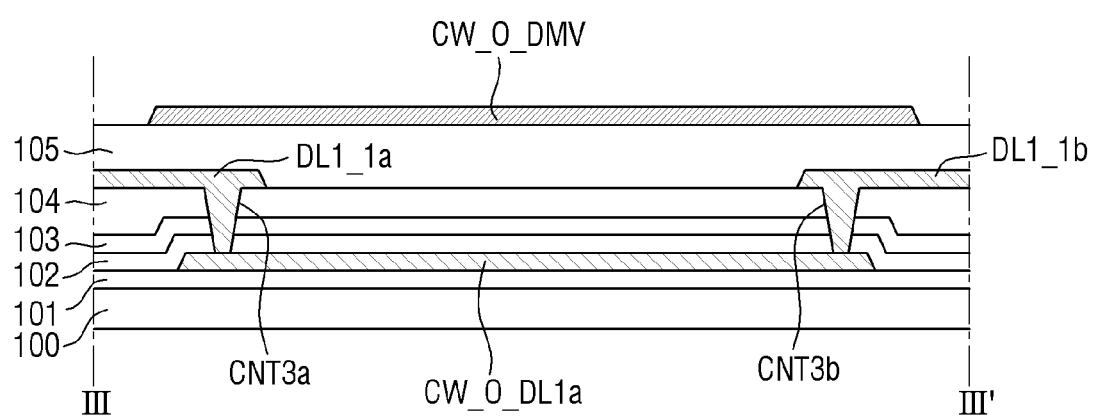
FIG. 16 is a cross-sectional view taken along line of FIG. 13.
Figure 17:
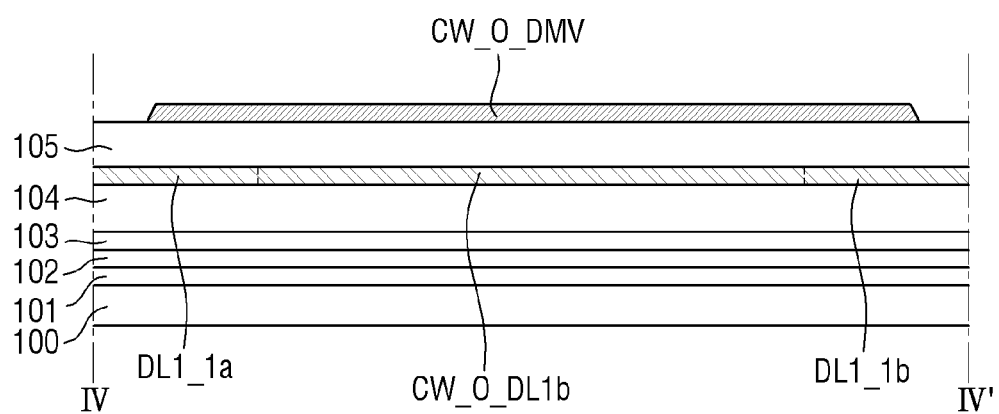
FIG. 17 is a cross-sectional view taken along line IV-IV' of FIG. 13.
Figure 18:
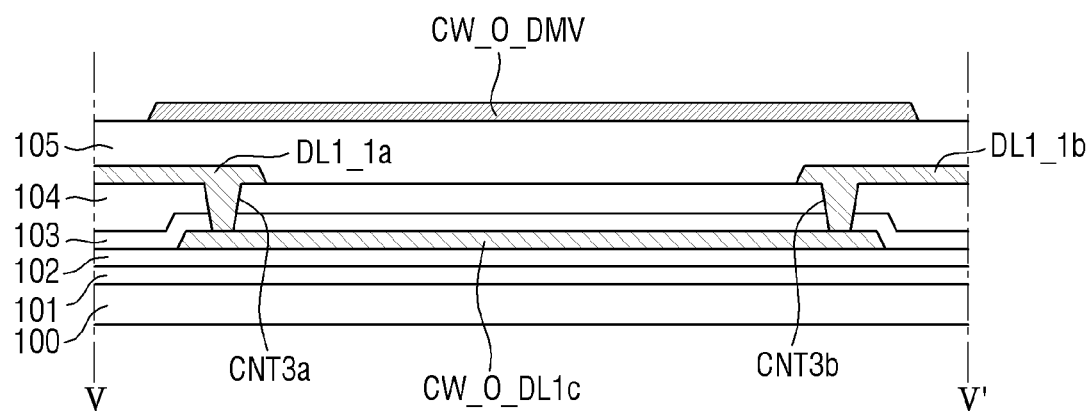
FIG. 18 is a cross-sectional view taken along line V-V' of FIG. 13.
Figure 19:
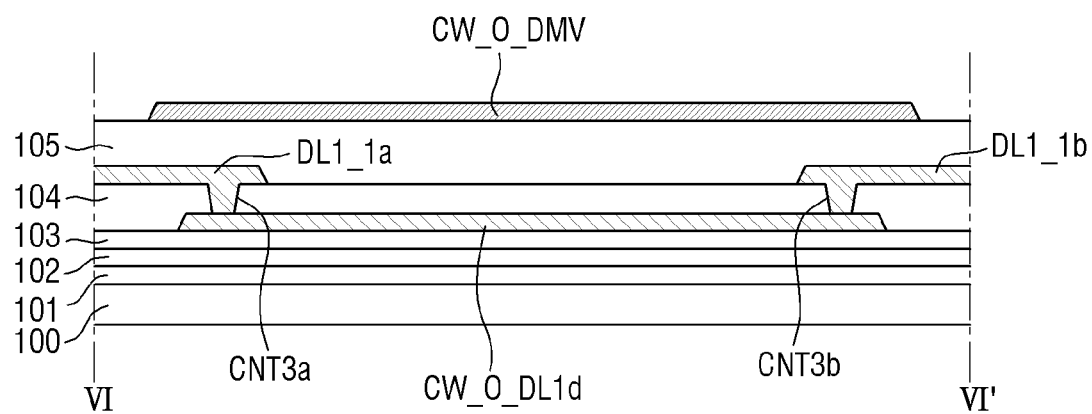
FIG. 19 is a cross-sectional view taken along line VI-VI' of FIG. 13.
Figure 20:
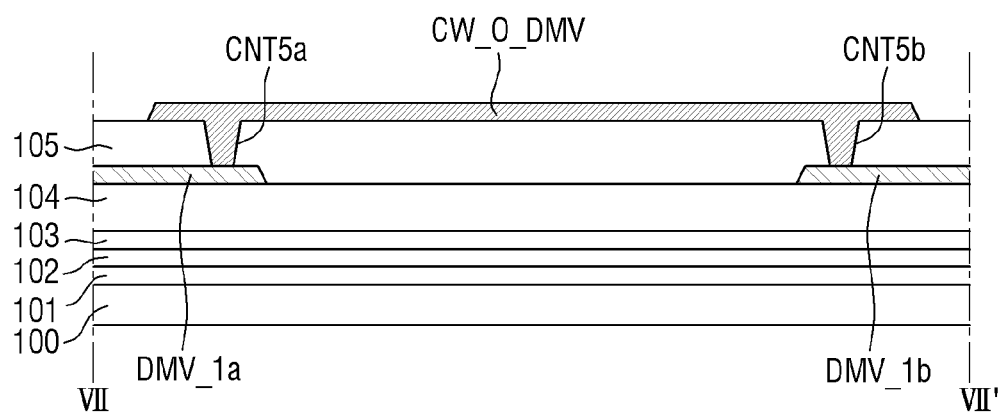
FIG. 20 is a cross-sectional view taken along line VII-VII' of FIG. 13.
Figure 21:
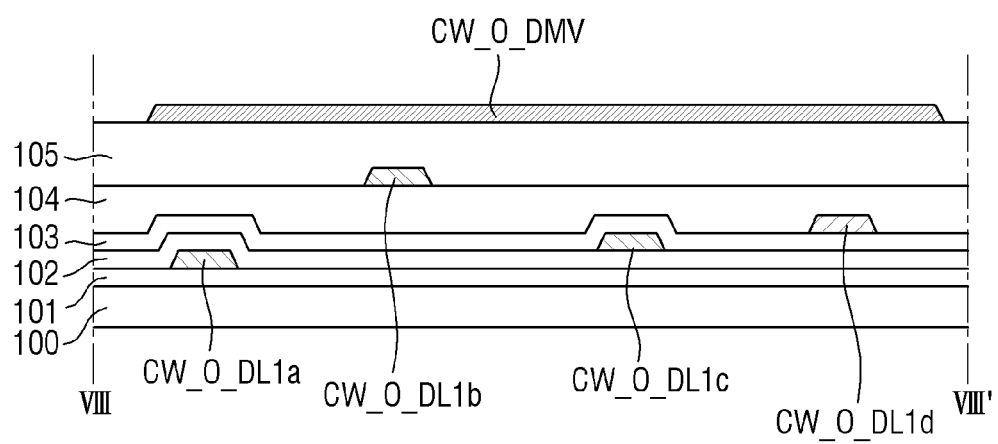
FIG. 21 is a cross-sectional view taken along line VIII-VIII' of FIG. 13.

FIG. 13 is an enlarged plan view illustrating an area B of FIG. 8. FIG. 14 is an enlarged plan view illustrating an area C of FIG. 9. FIG. 15 is an enlarged plan view illustrating an area D of FIG. 10. FIG. 16 is a cross-sectional view taken along line of FIG. 13. FIG. 17 is a cross-sectional view taken along line IV-IV' of FIG. 13. FIG. 18 is a cross-sectional view taken along line V-V' of FIG. 13. FIG. 19 is a cross-sectional view taken along line VI-VI' of FIG. 13. FIG. 20 is a cross-sectional view taken along line VII-VII' of FIG. 13. FIG. 21 is a cross-sectional view taken along line VIII-VIII' of FIG. 13.

Referring to FIGS. 13 to 21, the first sub data connection line may include a first first sub data connection line CW_O_DL1a positioned in the first gate conductive layer 120, a second first sub data connection line CW_O_DL1b positioned in the second data conductive layer 150, a third first sub data connection line CW_O_DL1c positioned in the second gate conductive layer 130, and a fourth first sub data connection line CW_O_DL1d positioned in the first data conductive layer 140.

On the plane, the second first sub data connection line CW_O_DL1b may be disposed between the first first sub data connection line CW_O_DL1a and the third first sub data connection line CW_O_DL1c, and the third first sub data connection line CW_O_DL1c may be disposed between the second first sub data connection line CW_O_DL1b and the fourth first sub data connection line CW_O_DL1d.

The first first to fourth first sub data connection lines CW_O_DL1a to CW_O_DL1d may be disposed repeatedly along the second direction DR2.

The first first sub data connection line CW_O_DL1a may be connected with the first sub data line DL1_1 through third contact holes CNT3a and CNT3b that pass through the fourth insulating layer 104, the third insulating layer 103 and the second insulating layer 102.

The second first sub data connection line CW_O_DL1b may be connected directly with the first sub data line DL1_1 positioned in the same layer.

The third first sub data connection line CW_O_DL1c may be connected with the first sub data line DL1_1 through the third contact holes CNT3a and CNT3b that are defined through the fourth insulating layer 104 and the third insulating layer 103.

The fourth first sub data connection line CW_O_DL1d may be connected with the first sub data line DL1_1 through the third contact holes CNT3a and CNT3b that are defined through the fourth insulating layer 104.

The second sub data connection line may include a first second sub data connection line CW_O_DL2a positioned in the first gate conductive layer 120, a second second sub data connection line CW_O_DL2b positioned in the first data conductive layer 140, a third second sub data connection line CW_O_DL2c positioned in the second gate conductive layer 130, and a fourth second sub data connection line CW_O_DL2d positioned in the second data conductive layer 140.

On the plane, the second second sub data connection line CW_O_DL2b may be disposed between the first second sub data connection line CW_O_DL2a and the third second sub data connection line CW_O_DL2c, and the third second sub data connection line CW_O_DL2c may be disposed between the second second sub data connection line CW_O_DL2b and the fourth second sub data connection line CW_O_DL2d.

The first second to fourth second sub data connection lines CW_O_DL2a to CW_O_DL2d may repeatedly be disposed along the second direction DR2.

The first second sub data connection line CW_O_DL2a may be connected with the second sub data line DL2_1 through fourth contact holes CNT4a and CNT4b that are defined through the fourth insulating layer 104, the third insulating layer 103 and the second insulating layer 102.

The second second sub data connection line CW_O_DL2b may directly be connected with the second sub data line DL2_1 positioned in the same layer.

The third second sub data connection line CW_O_DL2c may be connected with the second sub data line DL2_1 through the fourth contact holes CNT4a and CNT4b that are defined through the fourth insulating layer 104 and the third insulating layer 103.

The fourth second sub data connection line CW_O_DL2d may be connected with the second sub data line DL2_1 through the fourth contact holes CNT4a and CNT4b that are defined through the fourth insulating layer 104.

The sub constant voltage connection line CW_O_DMV may be connected with the sub constant voltage line DMV_1 through fifth contact holes CNT5a and CNT5b that are defined through the fifth insulating layer 105.

The sub constant voltage connection line CW_O_DMV may overlap the first first to fourth first sub data connection lines CW_O_DL1a to CW_O_DL1d and the first second to fourth second sub data connection lines CW_O_DL2a to CW_O_DL2d.

In an embodiment, as shown in FIG. 15, the sub constant voltage connection line CW_O_DMV may have a cylindrical electrode shape. The sub constant voltage connection line CW_O_DMV having a cylindrical electrode shape may be provided in plural, and one of the plurality of sub constant voltage connection lines CW_O_DMV may overlap the first first to fourth first sub data connection lines CW_O_DL1a to CW_O_DL1d, and the other one of the plurality of sub constant voltage connection lines CW_O_DMV may overlap the first second to fourth second sub data connection lines CW_O_DL2a to CW_O_DL2d.

A width of the sub constant voltage connection line CW_O_DMV may be greater than that of each of the first first to fourth first sub data connection lines CW_O_DL1a to CW_O_DL1d, and may be greater than that of each of the first second to fourth second sub data connection lines CW_O_DL2a to CW_O_DL2d.

As described above, according to an embodiment of the disclosure, the sub constant voltage connection line CW_O_DMV positioned in the pixel electrode layer 170 is included in an area of the hole area HLA except the through hole OP of the hole area HLA, and the sub constant voltage connection line CW_O_DMV may be insulated from the first and second sub data connection lines in an area of the hole area HLA except the through hole OP of the hole area HLA. In such an embodiment, the sub constant voltage connection line CW_O_DMV may avoid interference with the first and second sub data connection lines, and the sub constant voltage lines DMV_1a and DMV_1b at one side and the other side of the first direction DR1 may electrically be connected with each other based on the hole area HLA, such that voltage drop (IR drop) of a driving voltage may be suppressed or prevented from occurring. As a result, the display device 1 may be driven more actively.

Figure 22:
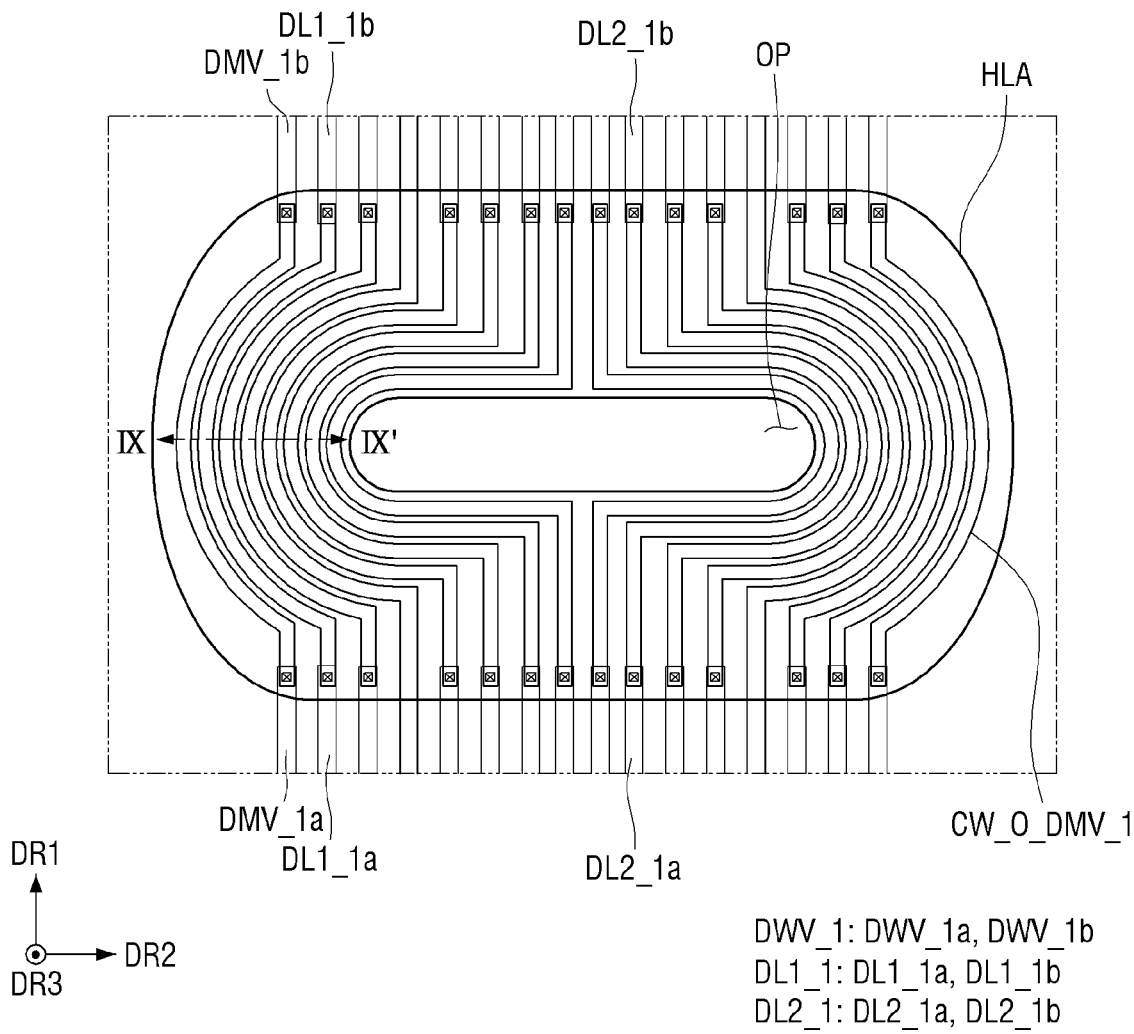
FIG. 22 is a plan view illustrating an area B of FIG. 8 according to an alternative embodiment of the disclosure.
Figure 23:
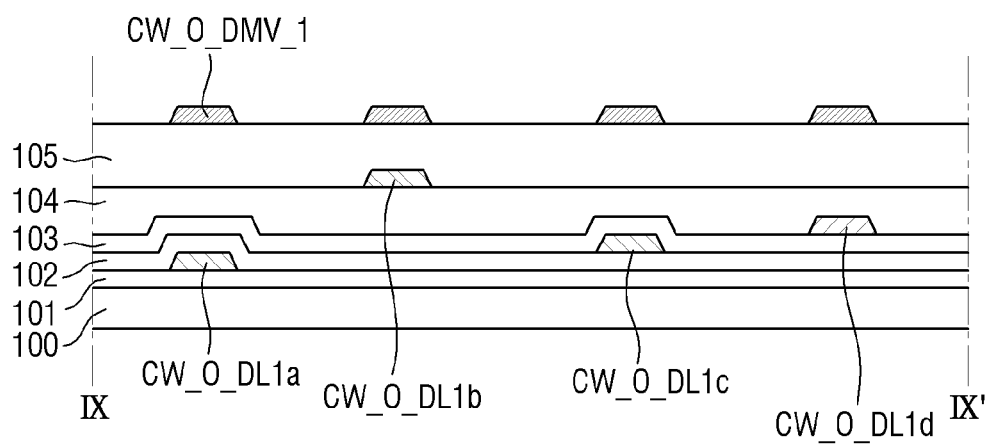
FIG. 23 is a cross-sectional view taken along line IX-IX' of FIG. 22.

FIG. 22 is a plan view illustrating an area B of FIG. 8 according to an alternative embodiment. FIG. 23 is a cross-sectional view taken along line IX-IX' of FIG. 22.

An embodiment of the display device shown in FIGS. 22 and 23 is substantially the same as the embodiments of the display device shown in FIGS. 13 and 21 except that the sub constant voltage connection lines CW_O_DMV_1 are defined by a plurality of separated lines.

In such an embodiment, the sub constant voltage connection lines CW_O_DMV_1 may include a plurality of separated lines. The plurality of separated lines of the sub constant voltage connection lines CW_O_DMV_1 may be disposed to be spaced apart from each other along the second direction DR2. In an embodiment, as shown in FIGS. 22 and 23, the plurality of separated lines of the sub constant voltage connection lines CW_O_DMV_1 may overlap the first first to fourth first sub data connection lines CW_O_DL1a to CW_O_DL1d in a thickness direction, but are not limited thereto.

In such an embodiment, the sub constant voltage connection line CW_O_DMV_1 positioned in the pixel electrode layer 170 is included in an area of the hole area HLA except the through hole OP of the hole area HLA, and the sub constant voltage connection line CW_O_DMV_1 may be insulated from the first and second sub data connection lines in an area of the hole area HLA except the through hole OP of the hole area HLA. Therefore, the sub constant voltage connection line CW_O_DMV_1 may avoid interference with the first and second sub data connection lines, and the sub constant voltage lines DMV_1a and DMV_1b at one side and the other side of the first direction DR1 may electrically be connected with each other based on the hole area HLA, such that voltage drop (IR drop) of a driving voltage may be suppressed or prevented from occurring. As a result, the display device may be driven more actively.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate in which an active area and a non-active area are defined, wherein the non-active area includes a first non-active area positioned at an edge of the active area and a second non-active area surrounded by the active area, and an optical hole is defined in the second non-active area through the substrate in a thickness direction;
   a first first sub constant voltage line disposed on the substrate and extended from the second non-active area in a first direction;
   a second first sub constant voltage line disposed on the substrate and extended from the second non-active area in a direction opposite to the first direction;
   a sub constant voltage connection line disposed on the substrate in the second non-active area and connecting the first first sub constant voltage line with the second first sub constant voltage;
   a first first sub data line disposed on substrate and extended from the second non-active area in the first direction;
   a second first sub data line disposed on the substrate and extended from the second non-active area in the direction opposite to the first direction; and
   a sub data connection line disposed on the substrate in the second non-active area and connecting the first first sub data line with the second first sub data line,
   wherein the sub data connection line is disposed in three or more different conductive layers, and
   the sub constant voltage connection line is disposed in a conductive layer different from a conductive layer in which the sub data connection line is disposed and insulated from the sub data connection line.

2. The display device of claim 1, wherein the first first sub constant voltage line is adjacent to the first first sub data line, and is disposed in a same conductive layer as the first first sub data line.

3. The display device of claim 2, wherein the second first sub constant voltage line is adjacent to the second first sub data line, and is disposed in a same conductive layer as the second first sub data line.

4. The display device of claim 3, wherein
   the first first sub constant voltage line and the second first sub constant voltage line are disposed in a same conductive layer as each other, and
   the first first sub data line and the second first sub data line are disposed in a same conductive layer as each other.

5. The display device of claim 4, wherein
   the sub data connection line includes a first sub data connection line disposed in a first conductive layer of the three or more different conductive layers, a second sub data connection line disposed in a second conductive layer of the three or more different conductive layers on the first conductive layer, a third sub data connection line disposed in a third conductive layer of the three or more different conductive layers on the second conductive layer, and a fourth sub data connection line disposed in a fourth conductive layer of the three or more different conductive layers on the third conductive layer.

6. The display device of claim 5, wherein the sub constant voltage connection line is disposed in a fifth conductive layer on the fourth conductive layer.

7. The display device of claim 6, wherein
   the third sub data connection line is disposed between the first sub data connection line and the second sub data connection line on a plane, and
   the second sub data connection line is disposed between the third sub data connection line and the fourth sub data connection line on the plane.

8. The display device of claim 7, wherein the first to fourth sub data connection lines are repeatedly arranged in the second non-active area along a second direction crossing the first direction.

9. The display device of claim 7, wherein the sub constant voltage connection line overlaps the first to fourth sub data connection lines on a plane.

10. The display device of claim 9, wherein the sub constant voltage connection line has a cylindrical electrode shape.

11. The display device of claim 7, wherein
    the sub constant voltage connection line is provided in plural, and
    each of a plurality of sub constant voltage connection lines has a line shape.

12. The display device of claim 7, further comprising:
    a plurality of first constant voltage lines extended in the first direction and arranged along a second direction crossing the first direction; and
    a plurality of second constant voltage lines extended in the second direction and arranged along the first direction,
    wherein the first constant voltage lines are disposed in a same layer as the first first sub constant voltage line, and
    the second constant voltage lines are disposed in a layer different from a layer in which the first constant voltage line is disposed.

13. The display device of claim 12, wherein the second constant voltage lines are disposed in a same layer as the fourth sub data connection line.

14. The display device of claim 12, wherein
each of the first constant voltage lines is electrically connected with at least one selected from the second constant voltage lines, and
each of the second constant voltage lines is electrically connected with at least one selected from the first constant voltage lines.

15. The display device of claim 12, further comprising:
a plurality of data lines extended in the first direction and spaced apart from the first constant voltage lines and the second constant voltage lines;
a line pad electrically connected with the data lines; and
a connection line electrically connecting a portion of the data lines with the line pad,
wherein the data lines include a first data line directly and electrically connected with the line pad, and a second data line electrically connected with the line pad through the connection line.

* * * * *